United States Patent
Udupa et al.

(10) Patent No.: US 7,088,149 B2
(45) Date of Patent: Aug. 8, 2006

(54) ENHANCING SNR AND THROUGHPUT PERFORMANCE OF INTEGRATED CIRCUITS

(75) Inventors: Anand Hariraj Udupa, Bangalore (IN); Visvesvaraya A. Pentakota, Bangalore (IN); Shakti Shankar Rath, Bangalore (IN); Gautam Salil Nandi, Bangalore (IN); Vineet Mishra, Bangalore (IN); Ravishankar S. Ayyagari, Bangalore (IN); Nitin Agarwal, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/724,517

(22) Filed: Nov. 29, 2003

(65) Prior Publication Data

US 2005/0116760 A1 Jun. 2, 2005

(51) Int. Cl.
*G11C 27/02* (2006.01)
(52) U.S. Cl. ........................................ 327/96; 327/563
(58) Field of Classification Search ................. 326/63, 326/68, 80, 81; 327/91, 94, 96, 561, 562, 327/563
See application file for complete search history.

(56) References Cited

U.S. PATENT DOCUMENTS

| | | | | |
|---|---|---|---|---|
| 5,378,943 A * | 1/1995 | Dennard | ...... | 326/68 |
| 5,414,314 A * | 5/1995 | Thurber, Jr. | ...... | 327/427 |
| 5,729,155 A * | 3/1998 | Kobatake | ...... | 326/68 |
| 5,847,607 A * | 12/1998 | Lewicki et al. | ...... | 330/258 |
| 6,040,729 A * | 3/2000 | Sanchez et al. | ...... | 327/309 |
| 6,259,313 B1 * | 7/2001 | Lewicki | ...... | 327/563 |
| 6,380,806 B1 * | 4/2002 | Ang | ...... | 330/258 |
| 6,429,716 B1 * | 8/2002 | Drapkin et al. | ...... | 327/333 |
| 6,518,818 B1 * | 2/2003 | Hynes | ...... | 327/333 |

* cited by examiner

*Primary Examiner*—Jeffrey Zweizig
(74) *Attorney, Agent, or Firm*—Frederick J. Telecky, Jr.; W. James Brady, III

(57) ABSTRACT

Low voltage transistors are used in high voltage environment. The low voltage transistors may be used in the path of processing of a signal to increase the throughput performance. By using high voltage supply associated with the high voltage environment, a higher SNR may be attained. Various techniques are implemented to ensure that the low voltage transistors are not damaged by prolonged exposure to high voltages.

29 Claims, 16 Drawing Sheets

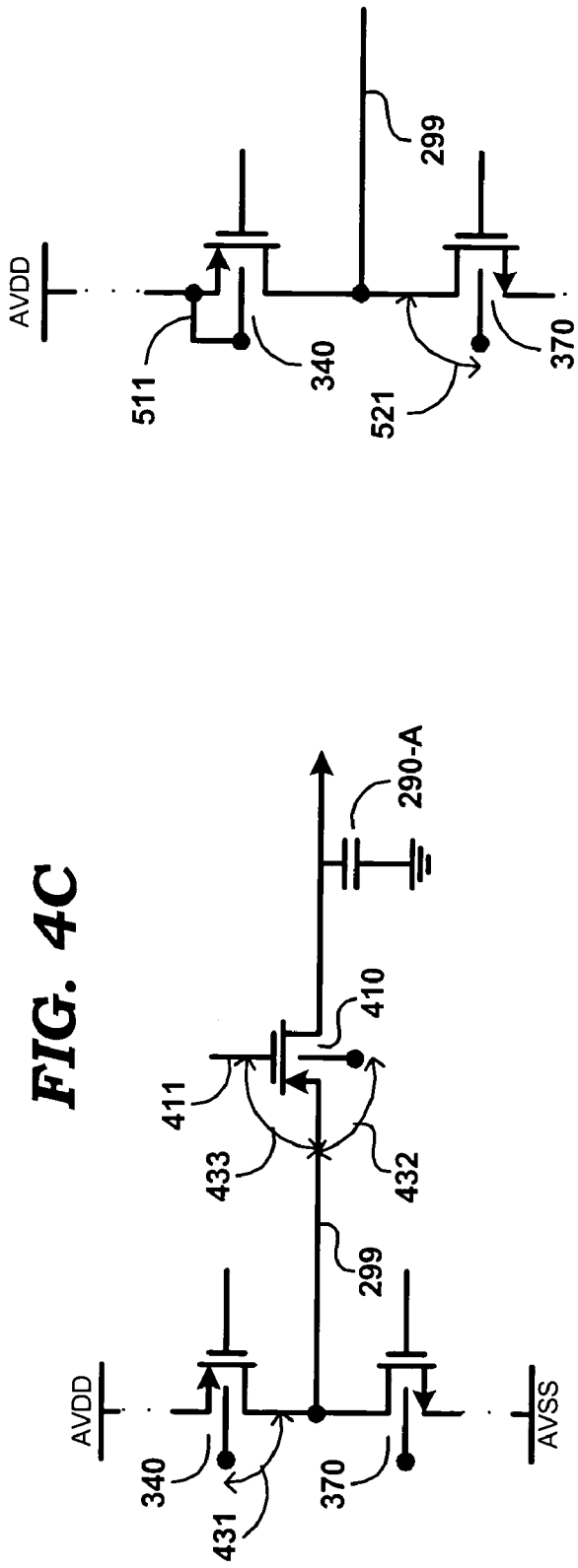
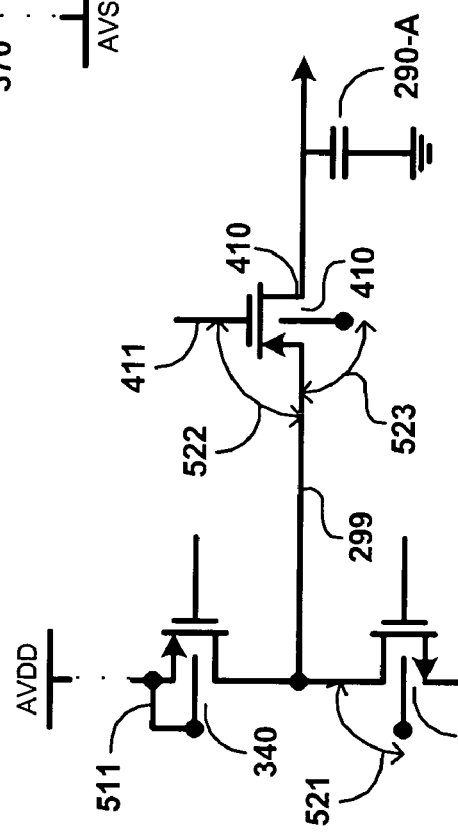
FIG. 5A
FIG. 4C
FIG. 5B

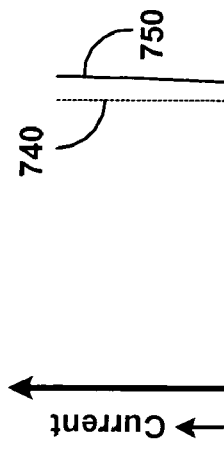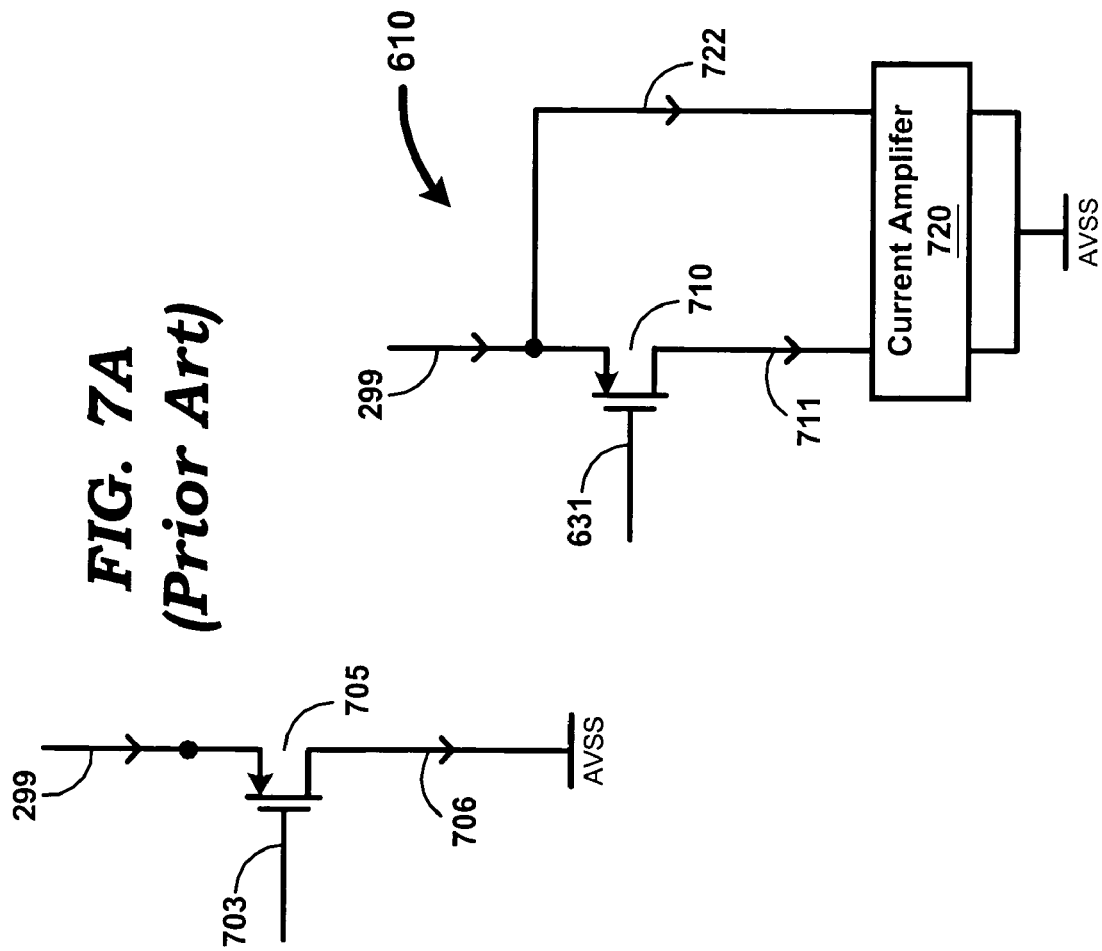

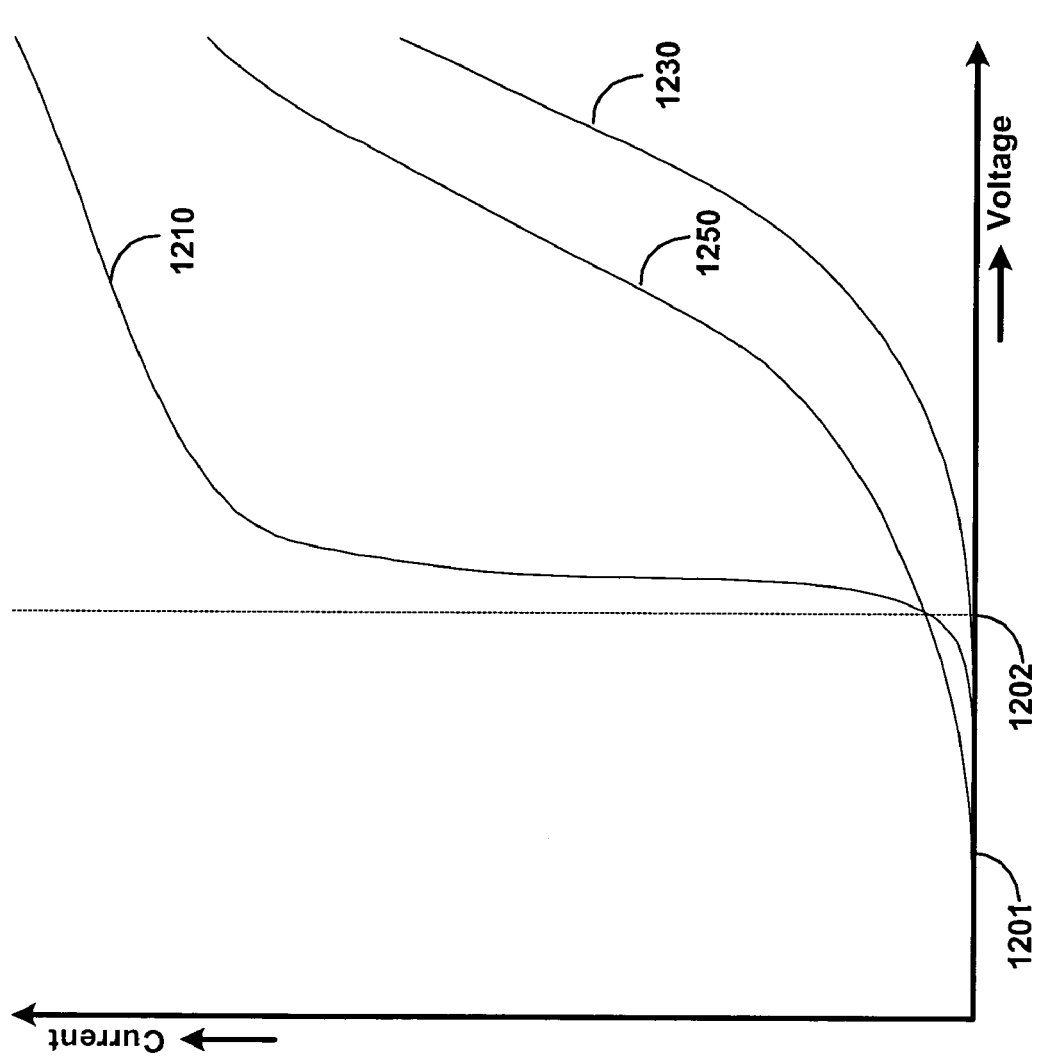

ENHANCING SNR AND THROUGHPUT PERFORMANCE OF INTEGRATED CIRCUITS

BACKGROUND OF THE INVENTION

1. Field of the Invention

The present invention relates to the design of electrical circuits, and more specifically to a method and apparatus for enhancing SNR (signal to noise ratio) and throughput performance of such circuits.

2. Related Art

Electrical circuits generally contain several transistors. A transistor may be designed for operation with higher voltages or lower voltages. For example, a transistor may be designed to operate with typical cross-terminal voltage (i.e., voltage across any two terminals) of 3.3 Volts or 1.8 Volts.

In the present application, transistors designed for operation with low(er) voltage(e.g., with 1.8V in the above example) are referred to as "low voltage transistors" and transistors designed for operation with high(er) voltage (e.g., with 3.3 Volts in the above example) are referred to as "high voltage transistors".

In general, circuits with high voltage transistors are more tolerant to noise (i.e., operate to provide a higher signal-to-noise-ratio (SNR)) since high voltage transistors generally support larger input signal swing, but provide a low throughput performance (i.e., operate using clocks of lower frequency). On the other hand, low voltage transistors provide lower SNR, but higher throughput performance.

It is often desirable that electrical circuits provide both high SNR and high throughput performance.

BRIEF DESCRIPTION OF THE DRAWINGS

Various features of the present invention will be described with reference to the following accompanying drawings.

FIG. 4C is a circuit diagram illustrating some problems encountered by a sampling transistor connected to the output of a cascode amplifier.

FIG. 5A is a circuit diagram illustrating the details of the approaches to address the problems in FIG. 4A in one embodiment.

FIG. 5B is a circuit diagram illustrating the details of the approaches to address the problems in FIG. 4B and additional problems encountered even after the approaches in one embodiment.

FIG. 7A is a circuit diagram illustrating the limitations of a prior clamping circuit in meeting one or more requirements of various embodiments described in the present application.

FIG. 7B is a circuit diagram illustrating the details of a high clamping circuit contained in the clamping circuit in an embodiment of the present invention.

FIG. 7C is a graph depicting voltage Vs current (V-I) characteristics of a high clamping circuit in one embodiment.

FIG. 12 is a graph depicting the details of V-I characteristics of the example implementations of the current amplifier of FIGS. 9, 10, and 11.

In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE PREFERRED EMBODIMENTS

1. Overview

Figure 1:
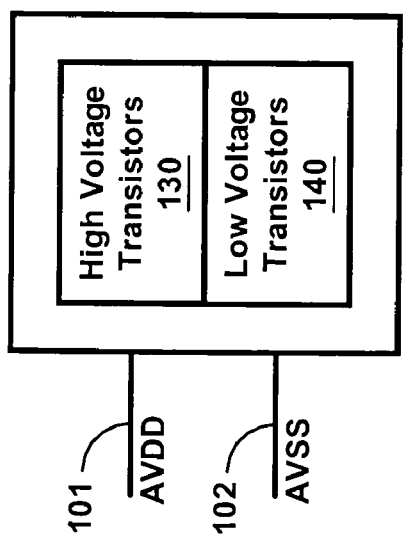
FIG. 1 is a block diagram logically illustrating the manner in which a low voltage transistor can be used in high voltage environment according to an aspect of the present invention.

According to an aspect of the present invention, low voltage transistors are used in a high voltage environment characterized by high supply voltage. The low voltage transistors may be used in the signal processing path to increase the throughput performance of the resulting electrical circuit. A high signal-to-noise-ratio (SNR) may be attained due to the use of the high supply voltage.

In one embodiment described below, a voltage substantially equaling a high supply voltage (of the high voltage environment) is applied at a terminal of a low voltage transistor. Higher voltages, compared to voltages that would have been applied if nominal/acceptable voltages only were applied at all terminals, may be applied at other terminals to ensure that the cross terminal voltages of the low voltage transistors are within the desired specification of the low voltage transistor.

Various other techniques may be employed to constrain the cross-terminal voltages of the low voltage transistors to an acceptable range (e.g., to the low voltage). For example, in the case of a PMOS transistor the bulk terminal and the source terminal are together connected to a voltage level slightly lower than the high supply voltage.

According to another aspect of the present invention, a clamping circuit is employed to ensure that the voltage at a node (or path) connecting to a low voltage transistor, is limited to a desired range. Various features of the present invention enable the clamping circuit to be implemented with a low parasitic capacitance and to not affect the current/voltage on the node substantially when the voltage at the node is otherwise within the desired range.

Another aspect of the present invention reliably detects a situation when a clock signal is stuck without transitions, and ensures that the voltage at nodes (which maybe affected by the clock stoppage) connecting to low voltage transistors are within acceptable voltage range within a short duration (after the clock signal is stuck). As a result, the low voltage transistors may not be exposed to unacceptably high voltage levels for a substantial duration, thereby avoiding damaging the low voltage transistors.

One more aspect of the present invention ensures that the voltage at a desired node (e.g., which provides biasing voltage to a clamping circuit) is at least at a pre-specified level when a corresponding target voltage (which would otherwise control the voltage at the node) is ramping up (usually when the device containing the electrical circuit is powering up). In an embodiment, the voltage at the slow (est)/farthest node is compared with a fraction of the supply voltage (which would rise almost instantaneously without much ramp-up time), and a voltage derived from the supply voltage is provided to the node if the voltage at the slowest node is below the compared fraction.

It may be appreciated that due to the features such as above, a low voltage transistor may be operated in a high voltage environment without necessarily using a corresponding low supply voltage derived from the high supply voltage (characterizing the high voltage environment). In other words, an aspect of the present invention provides an electrical circuit which contains low voltage transistors in a high voltage environment, but with voltage regulators not being used to provide a low voltage for the operation of the low voltage transistors.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Logical View

FIG. 1 is a block diagram logically illustrating the manner in which a low voltage transistor can be used in high voltage environment according to an aspect of the present invention. The block diagram is shown containing high voltage transistors 130 and low voltage transistors 140. The transistors and various aspects of the present invention are described using the following conventions:

High voltage transistor: A transistor designed to operate with a high cross terminal voltage. In the examples described below, high voltage equals 3.3 Volts.

Low voltage transistor: A transistor designed to operate with a low cross terminal voltage. In the examples described below, low voltage equals 1.8 Volts.

Maximum permissible voltage: Maximum cross terminal voltage to which a transistor can be subjected to (without much risk of damage over the life time of the transistor) according to specifications. For example, in the case of 1.8V (low voltage) transistors, the maximum permissible voltage can be as high as 2.4V.

It should be understood that the terms low and high, as used in the present application are relative terms. Thus, in an alternative embodiment using 3.3 Volts transistors in environments designed for 5 Volts transistors, 3.3 V transistors would be referred to as low voltage transistors and 5 V transistors would be referred to as high voltage transistors. In general, various aspects of the present invention would be applicable to several combinations of such lower and higher voltage transistors, as would be apparent to one skilled in the relevant arts by reading the disclosure provided herein.

Continuing with reference to FIG. 1, AVDD on path 101 constitutes a high voltage suitable for applying to one of the terminals (e.g., source terminal in the case of PMOS transistors) of each of high voltage transistors 130. Thus, the circuits of FIG. 1 containing AVDD may be referred to as a high voltage environment. AVSS 102 represents ground/reference voltage for operation of the transistors, and is merely shown for completeness. In an embodiment, (AVDD-AVSS) represents the high voltage. The voltage sources generating the various voltages are not shown in the Figures merely for conciseness.

The present invention enables low voltage transistors 140 also to be used in the high voltage environment. Various aspects of the present invention will be clearer by understanding the implementation of the features in example electrical circuits. Accordingly, an example electrical circuit is described below with reference to FIGS. 2 and 3.

3. Sample and Hold Amplifier

Figure 2:
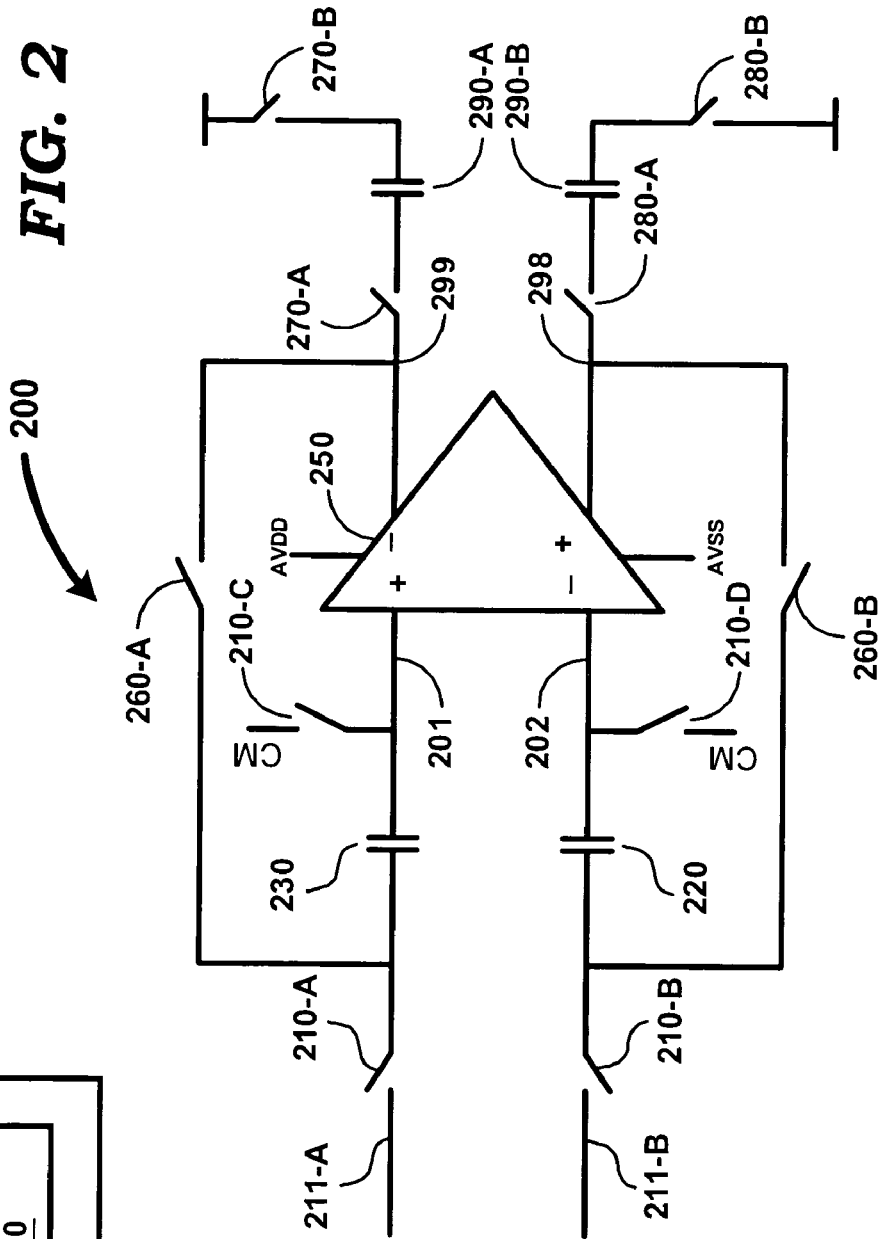
FIG. 2 is a circuit diagram of a sample and hold amplifier (SHA) illustrating an example circuit in which various features of the present invention can be implemented.
Figure 3:
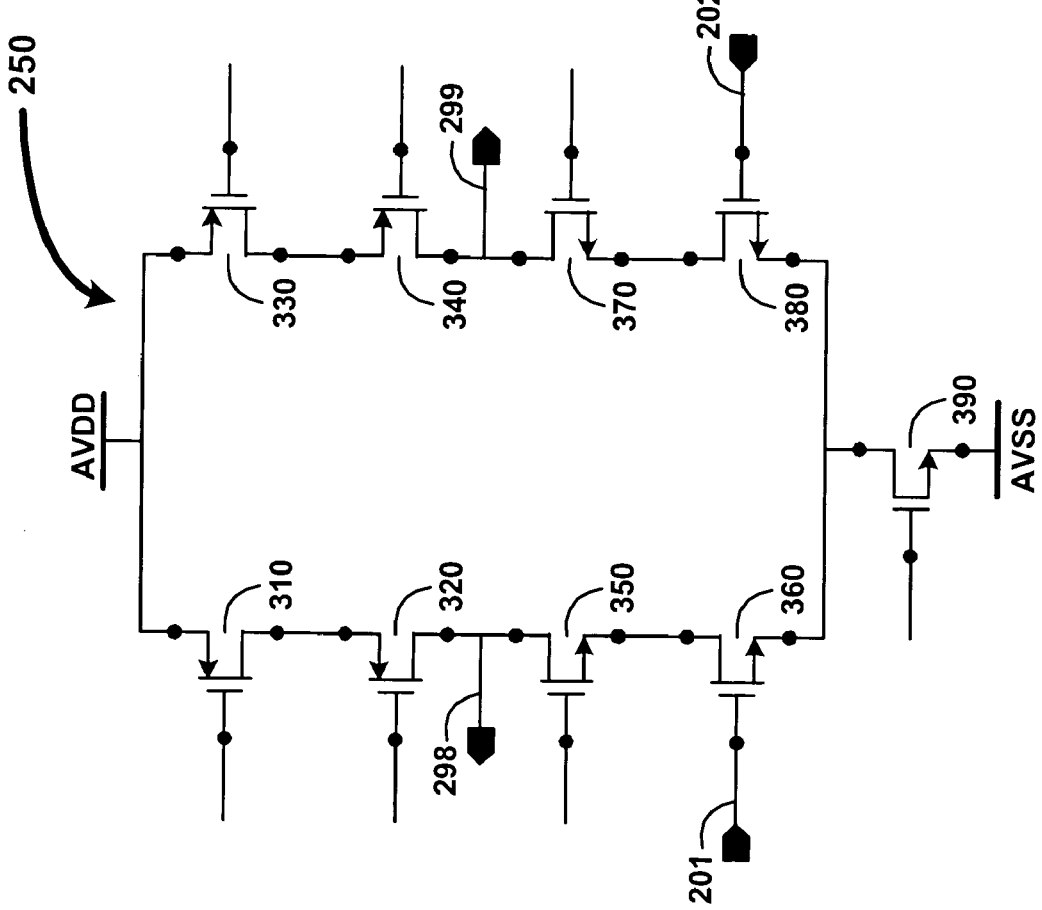
FIG. 3 is a circuit diagram illustrating the details of a cascode amplifier in one embodiment.

FIGS. 2 and 3 are circuit diagrams of sample and hold amplifier together illustrating an example circuit in which various features of the present invention can be implemented. In particular, FIG. 2 illustrates sample and hold operations performed by a sample and hold amplifier and FIG. 3 illustrates the implementation details of a cascode amplifier used in sample and hold amplifier.

FIG. 2 is a circuit diagram of a sample and hold amplifier illustrating an example prior embodiment which can be improved according to various aspects of the present invention. Sample and hold amplifier 200 is shown containing sampling switches 210-A through 210-D, sampling capacitors 220 and 230, cascode amplifier 250, hold switches 260-A and 260-B, capacitors 290-A and 290-B, and switches 270-A, 270-B, 280-A and 280-B.

Sample and hold amplifier 200 is shown receiving differential inputs diffp and diffm on paths 211-A and 211-B respectively, high voltage supply AVDD 101 and AVSS 102, and providing differential outputs outp and outm on paths 299 and 298 respectively. Sample and hold amplifier 200 samples and holds the signals received on paths 211-A and 211-B and operates as a unity gain amplifier by appropriate operation of switches as described below.

Sample and hold amplifier 200 samples a differential signal (diffp and diffm) provided on paths 211-A and 211-B onto sampling capacitors 220 and 230 in sampling phase. The Sampling phase occurs when sampling switches 210-A through 210-D are closed, and hold switches 260-A and 260-B are open. The sampled signals are provided as inp and inm on paths 201 and 202 respectively.

Sample and hold amplifier 200 holds the sampled signals when sampling switches 210-A through 210-D are open, and hold switches 260-A and 260-B are closed. Assuming a high gain (infinite, ideally) for cascode amplifier 250, the sampled input signals inp 201 and inm 202 are provided as an output on outp 299 and outm 298, with an amplification factor of 1.

Capacitors 290-A and 290-B, and switches 270-A, 270-B, 280-A and 280-B operate as a switched capacitor circuit as is well known in relevant arts. The switched capacitor circuit operates to sample and hold outp 299 and outm 298 for further processing (for example, to convert to a digital sample using an analog to digital converter as described in sections below). The description is continued with reference to an example implementation of cascode amplifier 250, illustrating the use of both high voltage and low voltage transistors.

FIG. 3 is a circuit diagram illustrating the details of cascode amplifier 250 in one embodiment (and is generally referred to as a telescopic cascode amplifier). Cascode amplifier 250 is shown containing PMOS transistors 310, 320, 330 and 340, and NMOS transistors 350, 360, 370, 380 and 390. Transistors 360 and 380 receive inp 201 and inm 202 on respective gate terminals. Transistors 310, 320, 330, 340, 350, 370 and 390 receive constant voltages on the respective gate terminals. Cascode amplifier 250 amplifies inp and inm inputs and provides the amplified signals outp and outm on paths 298 and 299 respectively.

It is often desirable to design amplifiers with high SNR and high throughput performance. As noted above in the Background Section, using high voltage transistors provides high SNR and low throughput performance, and using low voltage transistors provides low SNR and high throughput performance. An aspect of the present invention enables both high SNR and high throughput performance to be attained as described below.

4. High SNR and High Throughput Performance for Cascode Amplifier

Continuing with reference to FIG. 3, transistors 360 and 380 are chosen to be low voltage transistors to provide high throughput performance. In general, the speed of an amplifier is directly proportionate (or has positive correlation) to gm (trans-conductance) of input transistors receiving the input signals (inp and inm). As the trans-conductance of low voltage transistors is high, the throughput performance may be enhanced.

Transistors 320, 340, 350 and 370 may also be chosen to be low voltage transistors to provide high throughput performance. In general, the speed of an amplifier has a negative correlation with parasitic capacitance of output transistors. Since low voltage transistors offer low parasitic capacitance at the output, transistors 320, 340, 350 and 370 (connecting to output terminals outp and outm) are also implemented using low voltage transistors.

Transistors 310 and 330 may be chosen to be high voltage transistors. Due to the use of a high voltage supply, the output swing on paths 299 and 298 may be increased. In other words, sample and hold amplifier 200 supports larger input signal swing on paths 211-A and 211-B, which leads to higher SNR.

In an embodiment, high voltage transistors are designed to withstand a nominal cross terminal voltage of 3.3 Volts, and low voltage transistors are designed to withstand a nominal cross terminal voltage of 1.8 Volts.

While the choice of low and high voltage transistors provides high SNR and high throughput performance when examined in isolation, it may be appreciated that several problems are encountered due to the use of low voltage transistors in high voltage environment. For example, when transistor 310 (330) is on, a voltage of AVDD less a small voltage drop across transistor 310 (330) is applied at the source terminal of transistor 320 (340). Thus, a voltage substantially equaling the high voltage is applied at one of the terminals of the low voltage transistors.

Accordingly, at least with prolonged exposure to high voltages, the low voltage transistors may be damaged. Accordingly, a designer may need to implement corrective measures to ensure that the low voltage transistors are not damaged. In general, a designer needs to apply appropriate corrective measures to each of such problems to ensure that the electrical circuit operates in a desired manner. Some example problems and the manner in which the problems can be corrected are described below in further detail.

5. Example Problems

For illustration, it is assumed that high voltage supply AVDD varies between 3 and 3.9V, the differential voltage represented by outp 299 and outm 298 varies between 1V and 2V in normal operation, and low voltage transistors can withstand maximum terminal voltages of +/−2.4V. In general, prolonged exposure to voltages exceeding the maximum terminal voltages damages (e.g., decreases the lifetime) the transistors.

Figure 4A:
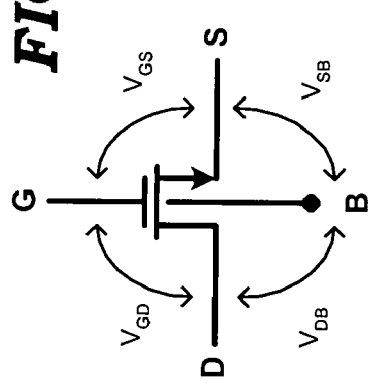
FIG. 4A contains a transistor illustrating the details of various conventions used to refer to cross terminal voltages.
Figure 4B:
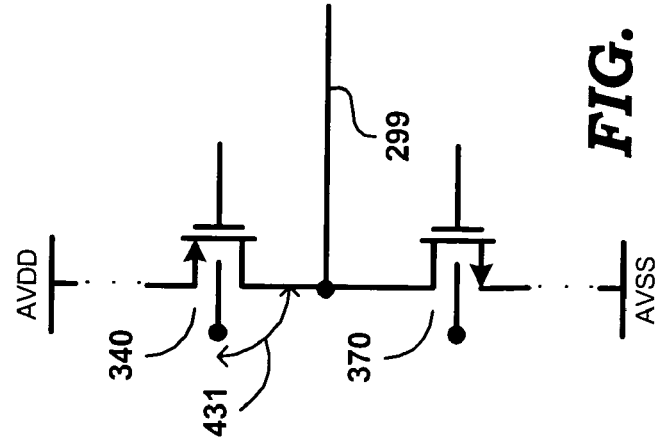
FIG. 4B is a circuit diagram illustrating some problems encountered by some of the low voltage transistors contained in a cascode amplifier.
Figure 5C:
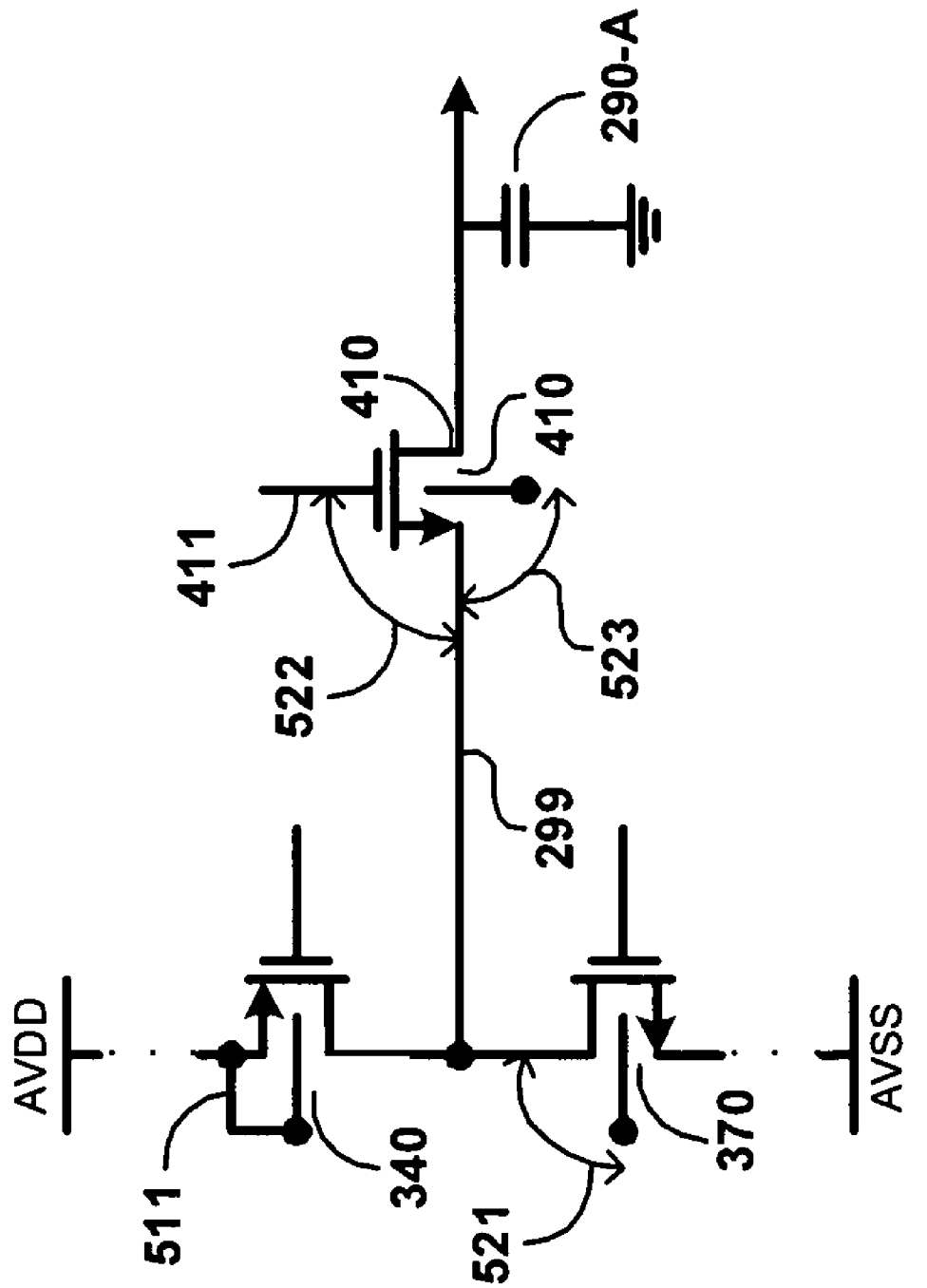
FIG. 5C is a circuit diagram illustrating the details of an alternative embodiment, which operates similar to the embodiment of FIG. 5B, but uses a NMOS transistor.

FIGS. 4A, 4B and 4C are circuit diagrams illustrating some of the problems encountered by the use of low voltage transistors in high voltage environment when outp 299 is at 0V. FIGS. 5A, 5B, and 5C are circuit diagrams illustrating the manner in which the problems (when outp 299 is at 0V) can be corrected, and additional problems presented even after the corrections when outp 299 is at 3.9V. FIGS. 5C and 5B differ only in that transistor 410 is implemented in PMOS and NMOS forms respectively. Some advantages of using NMOS form are described in further detail in a section below entitled. "17. Clock Level Selection".

Merely for illustration, the problems encountered by low voltage transistors in cascode amplifier 250 are described, however, similar problems may be encountered by low voltage transistors operating in other high voltage environments as well. The problems are numbered in the description below in order to be able to refer back when describing the corresponding solutions. In addition, the problems that would be encountered by low voltage transistors will be more clearer by describing various conventions used to refer terminal voltages. Accordingly, the conventions are described first with reference to FIG. 4A.

FIG. 4A is shown containing a transistor with four terminals—gate, source, drain and bulk. The maximum voltage level that can be applied between any two terminals depends on the transistor configuration. The voltage that can be applied between gate and drain, gate and source, drain and bulk, and source and bulk are shown with $V_{GD}$, $V_{GS}$, $V_{DB}$, and $V_{SB}$ respectively. In the illustrative example, the maximum permissible value for each of $V_{GD}$, $V_{GS}$, $V_{DB}$, and $V_{SB}$ is 2.4V. The description is continued with reference to some of the problems encountered in the circuit of FIG. 3.

FIG. 4B is a circuit diagram illustrating some of the problems encountered at the transistors connected to the output terminal. For illustration, the problems are described with reference to transistors 340 and 370. However, similar problems may be presented with respect to low voltage transistors 320 and 350 connected to outm 298.

Some of the problems are presented since the voltage across various pairs of terminals may exceed the corresponding permissible voltages. For example, 1.8V (low voltage) transistor can withstand a maximum voltage of 2.4V for each of $V_{GD}$, $V_{GS}$, $V_{DB}$, $V_{SB}$. The problems can be appreciated by understanding the voltage levels of the output signals in the high voltage environments and the manner in which bulk terminal is generally connected.

With respect to the voltage levels of the output signals in the high voltage environments, as described above with reference to FIG. 3, outp 299 depends on inp 201 and inm 202. When the voltage levels of inp 201 and inm 202 are within normal operating range of the high voltage environment, outp and outm will also change accordingly. In an embodiment, outp and outm change between 1V and 2V in normal operating range.

If inp and inm change beyond the normal operating range, outp and outm may change to undesirable voltage levels, which may be referred to as over-load condition. Inp and inm change beyond normal operating range if diffp and diffm change beyond normal operating range or if SHA 200 is in transient state (e.g, at the time of power up). The over-load condition may pose problems to low voltage transistors as described below.

With respect to bulk terminals, in general, the bulk terminal in PMOS transistors and NMOS transistors is connected to high voltage and ground respectively. Example problems are described below in view of the connections of the bulk terminals and the voltage levels of the output signals. For illustration, the problems are described by considering the extreme cases wherein each of outp and outm can approach either 0V or AVDD, however, outp and outm can have any voltage between 0V and AVDD.

Problem 1: Low voltage transistors 340, and 370 receive more than 2.4V when AVDD is 3.9V (in worst case), which may cause breakdown of the low voltage transistors. For example, assuming that outp 299 is at 0V, $V_{DB}$ of transistor 340 shown as 431 is 3.9V since bulk is connected to high voltage of 3.9V and drain is at 0V. The 3.9V voltage level is higher than the maximum voltage (2.4V) that can be withstood by a low voltage transistor. As a result, transistor 340 may breakdown.

Additional problems may be encountered if the output of cascode amplifier 250 is sampled using another transistor as described below with reference to FIG. 4C. Such sampling may be performed in various circuits (e.g., a sample and hold circuit in an ADC, as described with reference to FIG. 24).

With reference to FIG. 4C, the circuit diagram is shown containing PMOS transistor 410 and capacitor 290-A in addition to the components of FIG. 4B. Transistor 410 operates as switch 270-A of FIG. 2, and controls the operation of capacitor 290-A. Transistor 410 receives a clock signal on gate terminal 411, and is thus in a open state when the clock signal is at a high logical level and in a closed state otherwise. Transistor 410 may also be selected as a low voltage transistor for faster sampling and low parasitic capacitance on path 299.

Capacitor 290-A charges to outp when transistor 410 is in a closed state (e.g., when clock 411 is at low logical value). Some problems that are encountered by transistor 410 are described below for conciseness.

Problem 2: $V_{SB}$ (shown as 432) of transistor 410 is 3.9V since bulk of transistor 410 is connected to high voltage of 3.9V and source of transistor 410 is at 0V. The 3.9V voltage level is undesirable since it exceeds the maximum permissible voltage level of 2.4V.

Problem 3: $V_{GS}$ (shown as 433) of transistor 410 is 3.9V since gate receives 3.9V when clock 411 is at high logic level (3.9V) by assuming that the voltage levels of clock 411 are derived from AVDD. As described above, 3.9V is higher than the maximum voltage that can be withstood by a low voltage transistor (2.4V). Thus, the 3.9V of $V_{SB}$ 432 and $V_{GS}$ 433 may cause breakdown of transistor 410. The approaches which address these problems are described below with reference to FIGS. 5A and 5B.

6. Solutions For Problems When Outp Approaches 0V

FIG. 5A is a circuit diagram illustrating an approach to address problem 1 in one embodiment. Bulk terminal is shown connected to the source terminal as shown by line 511 (instead of a high voltage (AVDD)). Due to the voltage drop across transistor 330 (shown in FIG. 3), $V_{DB}$ of transistor 340 would be less than AVDD, which may reduce the voltage $V_{DB}$ of transistor 340.

In addition, bulk terminal of PMOS transistor generally needs to be at least as high as the voltage as that at source or drain terminals. Connecting bulk terminal to source terminal would ensure that the bulk terminal is at higher voltage than at gate and drain terminals due to the respective voltage drop across transistor 340. The voltage at bulk terminal equals the voltage at source terminal due to path 511.

FIG. 5B is a circuit diagram illustrating an approach to address problems 2 and 3 in one embodiment. In particular, problem 2 noted above is addressed by designing clock 411 to low and high levels to correspond to 0V and 2V respectively. Since high level of clock 411 is at 2V (greater than the low voltage) and outp 299 is at 0V, $V_{GS}$ 433 is 2V, which is less than the maximum limit (2.4V).

In general, the difference of voltage levels representing low and high levels of the clock signal needs to be selected to be within the maximum permissible voltage levels (2.4 in the illustrative example) permitted by the low voltage transistors. Some additional considerations in choosing the voltage levels of the clock signal are described below with reference to FIGS. 13 and 14.

Continuing with reference to addressing problem 3 noted above, as is well known, usually the bulk terminal is provided a corresponding Vdd value (1.8 Volts in this case) appropriate for the (low voltage) transistor. Instead, according to an aspect of the present invention, the bulk terminal is connected to a voltage level greater than such Vdd value. In one embodiment, bulk terminal of transistor 410 is connected to 2.1V. Such a connection ensures that $V_{SB}$ 432 is less than 2.4V. In an embodiment, the 2.1V is generated using a regulator(not shown), which receives AVDD (3.3V) and generates 2.1V. The regulator may be implemented in a known way.

While the circuit of FIG. 5B addresses problems 1–3 (encountered when outp 299 is at 0V), the circuit may encounter additional problems when outp 299 is at 3.9V (worst case maximum voltage possible value for AVDD) as described below.

7. Problems When Outp Approaches 3.9V

Problem 4: Transistors 370 and 410 receive higher voltages (3.9V) when outp 299 is at 3.9V, which is undesirable since the two transistors are implemented as low voltage transistors. For example, $V_{DB}$ of transistor 370 shown as 521 equals 3.9V since bulk terminal is connected to 0V and drain terminal is at 3.9V.

Problem 5: $V_{SB}$ (shown as 523) of transistor 410 is at 1.8V (3.9−2.1) since bulk is connected to 2.1 V and source is at 3.9V. Such a high value (greater than the corresponding threshold voltage) of $V_{SB}$ may cause forward bias of transistor 410. Forward biasing is generally undesirable at least in that a high amount of current is drawn.

Problem 6: $V_{GS}$ (shown as 522) of transistor 410 is at a maximum voltage of 3.9V since the gate terminal receives 0V when clock 411 is at low logic level, which may also cause breakdown of transistor 410. Additional problems when outp approaches 0Volts are described below.

8. Additional Problems When Outp Approaches 0 Volts

Continuing with reference to FIGS. 5A and 5B, it may be appreciated that additional problems may be presented when outp equals 0 Volts, as noted below.

Problem 7: The $V_{DB}$ (drain to bulk voltage) of transistor 340 is greater than the maximum permissible voltage level of 2.4 Volts. The underlying reason can be appreciated by noting that the drain terminal receives 0 Volts and the bulk terminal receives voltage equaling (3.9-drop across transistor 330). The drop across transistor 330 may be in the 1 Volt range. Thus, about 2.9 volts may be applied across $V_{DB}$ of transistor 340, in violation of the maximum permissible voltage of 2.4. A clamping circuit addresses problem 7 as well, as described below in further detail.

9. Clamping Circuits in General

At least in the embodiments described in the present application, it is desirable that the clamping circuit provide one or more of the following features:

A. have low parasitic capacitance or provide low load to path 299;

B. should not affect (e.g., not draw substantial current) path 299 when voltage is otherwise in the desired range;

C. needs to draw high current potentially immediately if the voltage on path 299 falls outside of the desired range.

The limitations one prior embodiment in meeting one or more of such features is described now with reference to FIG. 7A. FIG. 7A is shown containing PMOS transistor 705 having the source terminal connected to path 299 and biased by bias voltage 703. Broadly, PMOS transistor 705 turns on when the voltage on path 299 exceeds (bias voltage+threshold voltage of transistor 705), and draws current on the source terminal to pull down the voltage on path 299. Accordingly, the circuit may operate to keep the voltage on path 299 below a desired voltage equaling (bias voltage+ threshold voltage of transistor 705).

As noted above in (C), the circuit needs to draw high current if the voltage on path 299 exceeds the desired voltage. Such a requirement can be met by using large sized PMOS transistor 705. One problem with large transistors is that they generally have a correspondingly high parasitic capacitance and thus provide a correspondingly high capacitive load to path 299 even during normal operation (when clamping need not be operative). Accordingly, using large sized PMOS transistors may be undesirable.

The current drawn (in scenario (C)) can also be increased by increasing source to gate voltage (Vsg) of PMOS transistor 705 as is well known in the relevant arts. To increase Vsg of transistor 705, the bias voltage may need to be reduced since Vsg equals (Voltage at outp 299−bias voltage), wherein '−' represents subtraction operator. However, reducing the bias voltage may cause a correspondingly more current to be drawn even when the voltage on path 299 is within the desired range (since the transistor draws current even when Vsg is less than |Vt|), wherein |Vt| represents the absolute value of Vt. Accordingly, it may be undesirable to increase Vsg of PMOS transistor 705.

Accordingly, the approach of FIG. 7A may be inadequate in attaining one or more of the features (A) through (C) noted above. The manner in which various aspects of the present invention operate to provide one or more of such features is described below in further detail.

10. Low Parasitic Clamping Circuit

Figure 6B:
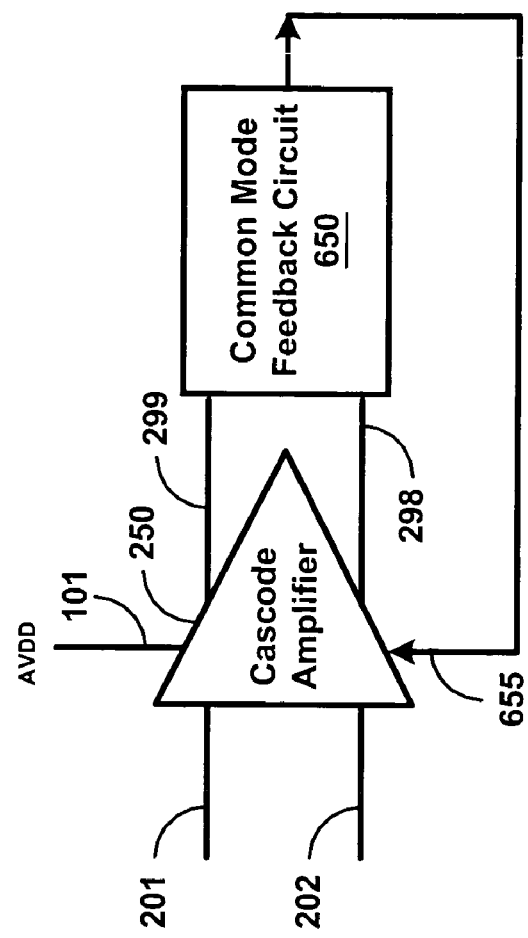
FIG. 6B is a block diagram illustrating an example approach to select Vlclamp (lower clamp voltage) in one embodiment.
Figure 6A:
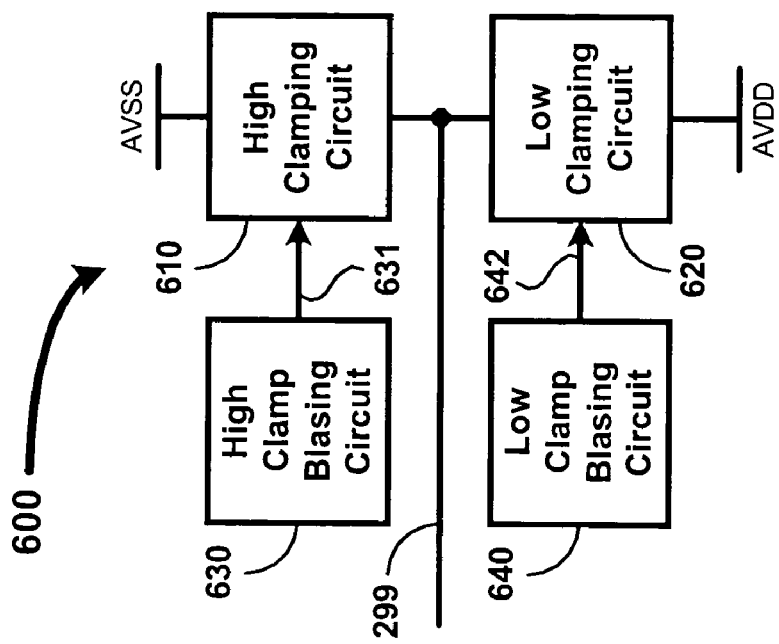
FIG. 6A is a block diagram illustrating the details of a clamping circuit in an embodiment of the present invention.
Figure 8B:
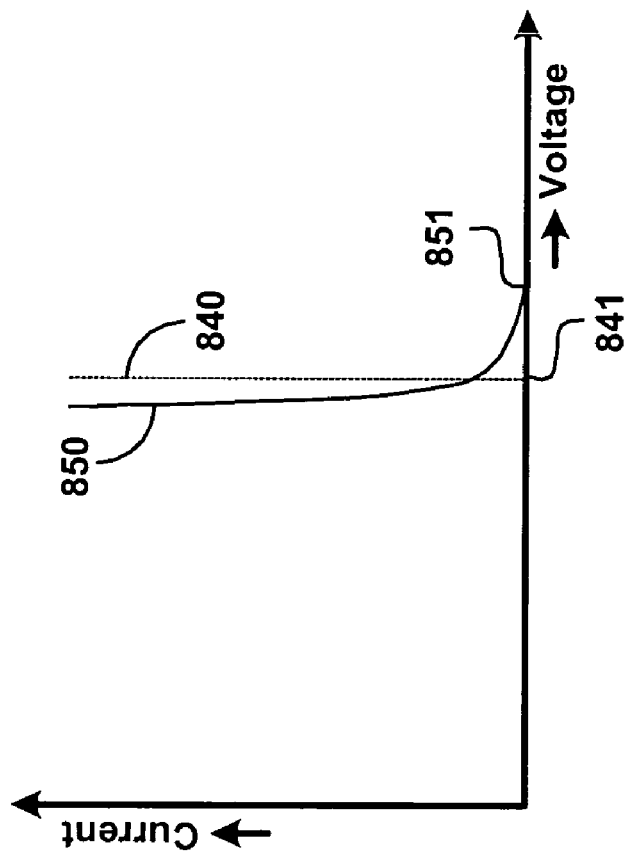
FIG. 8B is a graph depicting voltage Vs current (V-I) characteristics of the low clamping circuit in one embodiment.
Figure 8A:
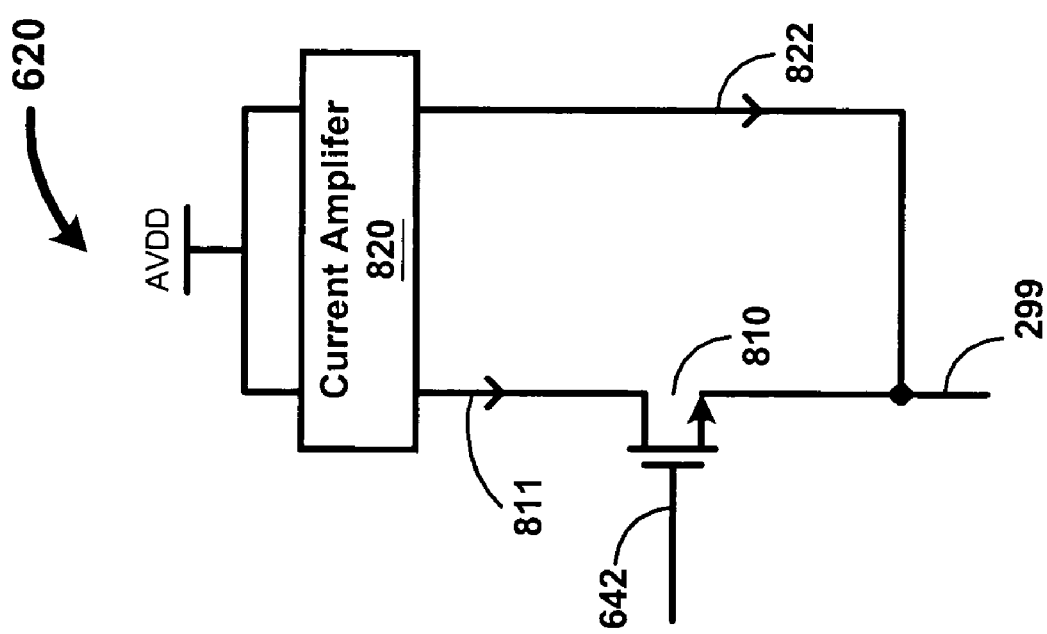
FIG. 8A is a circuit diagram illustrating the details of low clamping circuit contained in the clamping circuit in an embodiment of the present invention.
Figure 11:
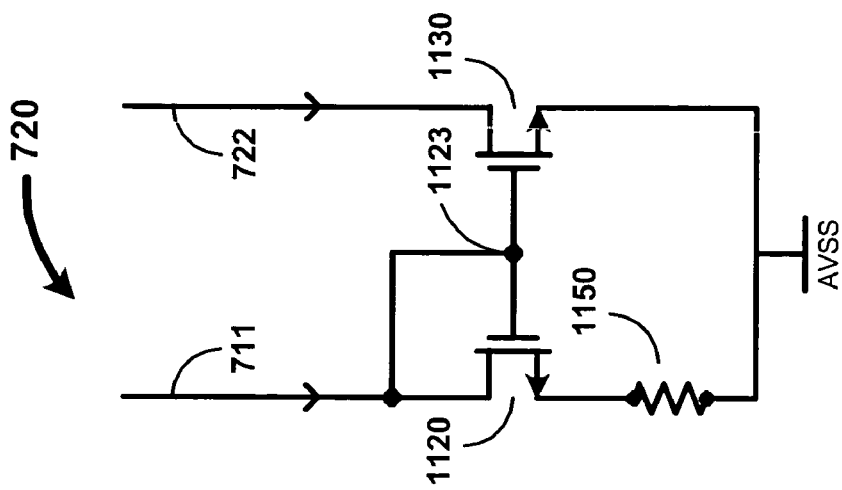
FIGS. 9, 10 and 11 are circuit diagrams illustrating the details of various example implementations of a current amplifier.
Figure 10:
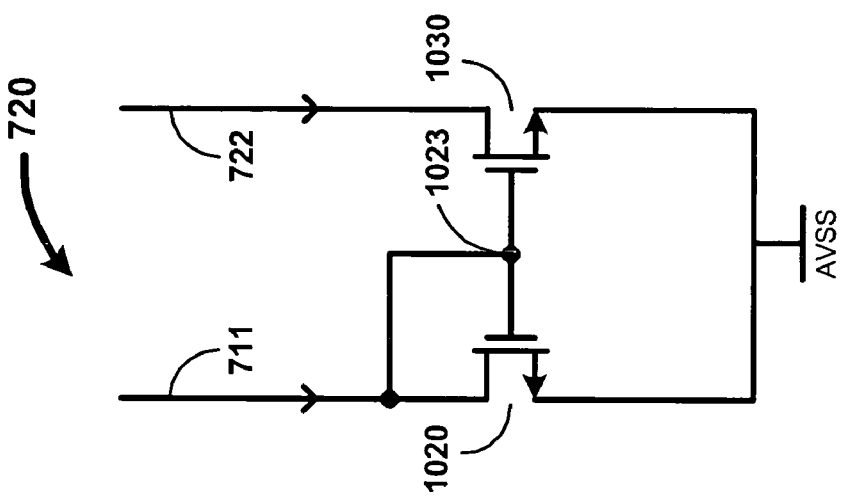
Figure 9:
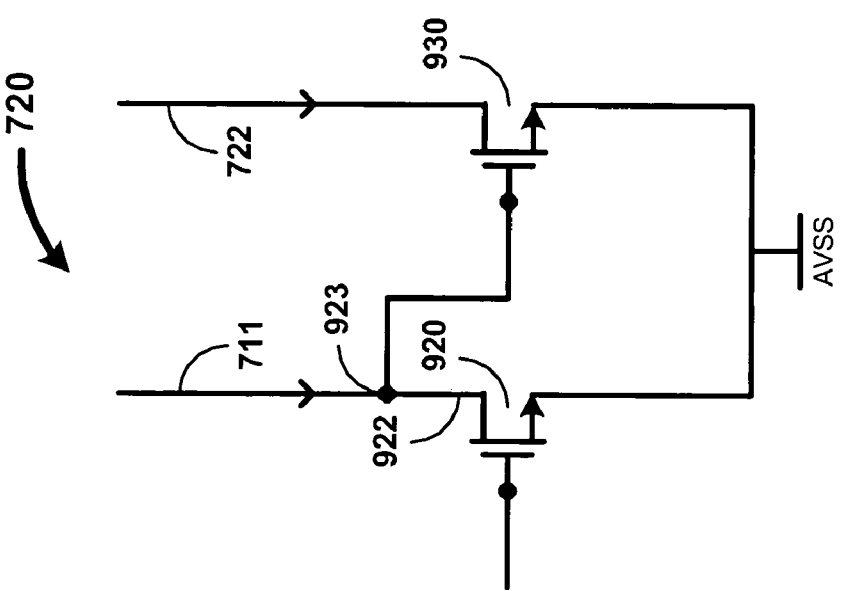

FIGS. 6A, 7B, 7C, 8A, 8B, and 9–12 are diagrams together illustrating the details of a clamping circuit in an embodiment of the present invention. In particular, FIG. 6A is a block diagram illustrating the details of a clamping circuit, FIG. 7B is a circuit diagram illustrating the details of high clamping circuit, FIG. 7C is a graph depicting the corresponding response of the high clamping circuit, FIG. 8A is a circuit diagram illustrating the details of low clamping circuit, FIG. 8B is a graph depicting the corresponding response of the low clamping circuit, FIGS. 9–11 are circuit diagrams illustrating various example implementations of a current amplifier used in the high clamping circuit, and FIG. 12 is a graph depicting the response corresponding to the embodiments of FIGS. 9–11.

While the clamping circuit is described in the context of clamping the voltage on path 299, it should be understood that the approaches can be used in other environments in which it is desirable to clamp the voltage at any node to above/below a desired level. The manner in which features noted in the above section may be attained is described below with reference to FIGS. 6A, 7B, 7C, 8A, 8B, and 9–12.

Continuing with reference to FIG. 6A, clamping circuit 600 is shown containing high clamping circuit 610, low clamping circuit 620, high clamp biasing circuit 630, and low clamp biasing circuit 640. For illustration, the clamping is described with reference to path 299, however, clamping can be used at any node to clamp the voltage to a desired voltage level. Each block is described in detail below.

High clamping circuit 610 clamps/limits the voltage level of outp on path 299 to a desired voltage level (Vhclamp equals 2.4V). Vhclamp represents a high thresold voltage level to which outp 299 may be clamped when outp approaches a voltage representing high level. Such clamping ensures that outp 299 is always less than or equal to 2.4V, which can be withstood by low voltage transistors.

Similarly, low clamping circuit 620 clamps/limits the voltage level of outp on path 299 to a desired voltage level (Vclamp equals 0.6V). Vlclamp represents a low thresold voltage level to which outp 299 may be clamped when outp approaches a voltage representing low level. Such clamping ensures that outp 299 is not less than 0.6V. The voltage range of 0.6 V to 2.4 V may enable a voltage swing between 1V and 2V at the output. The clamps solve problems 4, 5, and 6 by constraining output to 2.4V. In addition, problem 7 noted above is solved due to the clamping to 0.6 V since $V_{DB}$ of transistor 340 (of FIGS. 5A and 5B) would now be below (2.9−0.6=2.3 Volts), within the maximum permissible voltage level (2.4 Volts).

It should be understood that the high clamping circuit and the low clamping circuit together define a specified range in which the voltage of outp 299 (node) is maintained. It may be further appreciated that the only one of high and low clamping circuits may be used depending on the requirements of the specific environments. In such a situation, one of the corresponding limit (upper or lower) may be said to have an undefined (positive or negative infinite) value.

High clamp biasing circuit 630 generates the required bias voltage (bias 1) on path 631 to high clamping circuit 610. Bias1 voltage is generated in such a way that high clamping circuit 610 draws low current when outp 299 is less than the voltage level (Vhclamp) to which outp 299 is to be clamped, and draws high current when outp 299 is greater than Vhclamp. The specific value of bias1 may be dependent on the implementation of high clamping circuit as described below with reference to FIG. 7B.

Similarly, low clamp biasing circuit 640 generates the required bias voltage (bias2) on path 642 to low clamping circuit 620. Bias2 voltage is generated in such a way that low clamping circuit 640 draws low current when outp 299 is more than the voltage level (Vlclamp) to which outp 299 is to be clamped, and draws high current when outp 299 is less than or equal to Vlclamp. Low clamp biasing circuit 640 and high clamp biasing circuit 630 may be implemented in a known way.

The remaining blocks of FIG. 6A are described below in further detail. The manner in which the three features (A)–(C) noted above are attained is also contained in the description.

11. High Clamping Circuit

FIGS. 7B and 7C are diagrams together illustrating the details of high clamping circuit 610 in an embodiment of the present invention. High clamping circuit 610 is shown containing PMOS transitor 710 and current amplifier 720. Each component is described below.

PMOS transistor 710 receives outp 299 on source terminal and bias1 voltage on gate terminal 631. Bias1 equals (Vhclamp−|Vt| of transistor 710), (wherein |x| represents the absolute value of x) which causes transistor 710 to be turned on when outp 299 is greater than or equal to Vhclamp. Transistor 710 draws high current when turned on, and operates as a open switch otherwise.

Thus, transistor 710 draws a portion of the current that flows through path 299 when outp 299 is not less than (bias1+|Vt| of transistor 710). In the illustrative example, bias1 equals (2.4−|Vt| of transistor 710) such that high clamping circuit 610 clamps the voltage level on path 299 to 2.4V.

Current amplifier 720 draws from path 722 (and thus 299) a large amount of current when PMOS transistor 710 conducts (i.e., when there is current on path 711). The drawing of such a large amount of current enables the voltage on outp 299 to be clamped to the desired voltage level (Vhclamp) (as required by feature (C) noted above.

In addition, current amplifier 720 may not draw any current when PMOS transistor 710 does not conduct as required by feature (B) noted above. As a result, high clamping circuit 610 may not affect the voltage on path outp 299 when voltage level on path 299 is less than 2.4 Volts in the illustrative example.

Further more, PMOS transistor 710 can be chosen to be of small size, thereby not providing substantial parasitic capacitance. Current amplifier 720 may be designed not to provide substantial parasitic capacitance as described below with various examples. As a result, feature (A) noted above may also be attained.

Thus, various aspects of the present invention enable high clamping to be performed while attaining the three features (A) through (C) noted above. The operational characteristics of high clamping circuit due to the operation of current amplifier 720 and transistor 710 is described in further detail with reference to FIG. 7C.

12. Voltage vs. Current (V-I) Characteristics of High Clamping Circuit

FIG. 7C is a graph depicting V-I characteristics of high clamping circuit 610 in one embodiment. The voltage at outp 299 is represented on X-axis and the corresponding current drawn by high clamping circuit 610 is represented on Y-axis.

Vertical line 740 represents the characteristics of an ideal clamping circuit that is desirable. As may be readily observed, high clamping circuit 610 does not draw any current until point 741 (representing Vhclamp), but draws infinite amount of current when the voltage exceeds point 741.

Line 750 indicates the characteristics of high clamping circuit 610. Utmost negligible amount of current is drawn up to point 751. Point 751 approximately equals bias1, and thus has a value less than Vhclamp 741. The increase of current is gradual as voltage on outp 299 increases from point 751 until the voltage reaches Vhclamp 741, after which the increase in current is steep.

Due to such operation, high clamping circuit 610 clamps outp 299 to Vhclamp. The description is continued with reference to low clamping circuit 620.

13. Low Clamping Circuit

FIGS. 8A and 8B are diagrams together illustrating the details of low clamping circuit 620 in one embodiment. Low clamping circuit 620 is shown containing NMOS transistor 810 and current amplifier 820. Each component is described below.

NMOS transistor 810 receives outp 299 on source terminal and bias2 voltage on gate terminal 642. Bias2 equals (Vlclamp+|Vt| of transistor 810), which causes transistor 810 to be turned on when outp 299 is less than Vlclamp. Transistor 810 draws high current when turned on, and operates as a open switch otherwise.

Thus, transistor 810 draws/senses the current that flows through path 299 when outp 299 is less than (bias2−|Vt| of transistor 810). In the illustrative example, bias2 equals (0.6+|Vt| of transistor 810) such that low clamping circuit 620 clamps the voltage level on path 299 to 0.6V. Vlclamp is chosen to equal 0.6V when Vhclamp is 2.4V to maintain a common mode voltage of 1.5V, which is further described in sections below. In the illustrative example, the common mode voltage is 1.5V since outp 299 changes between 1V and 2V.

Current amplifier 820 draws from path 822 a large amount of current when NMOS transistor 810 conducts (i.e., when there is current on path 811). The drawing of such large amount of current enables the voltage on outp 299 to be clamped to the desired voltage level (Vlclamp). In addition, current amplifier 820 may not draw any current when NMOS transistor 810 does not conduct, thereby not affecting the voltage on path outp 299 when voltage level on path 299 is greater than 0.6 Volts in the illustrative example.

Hence, current amplifier 820 is used to draw the additional current that would flow when voltage outp 299 is not greater than Vlclamp. It may be observed that low clamping circuit 620 also provides several of the advantages provided by high clamping circuit 610. The manner in which Vlclamp may be selected is described below with reference to FIG. 6B.

14. Selection of Vlclamp

FIG. 6B is a block diagram illustrating an example approach to select the value of Vlclamp in one embodiment. The block diagram is shown containing cascode amplifier 250 and common mode feedback circuit 650.

Common mode feed back circuit 650 ensures a common mode voltage of cascode amplifier 250 to be maintained irrespective of signal changes at the input. In the illustrative example, the common mode voltage equals 1.5V, as noted above. Common mode feed back circuit 650 adjusts cascode amplifier 250 to attain a common mode voltage of 1.5V even in over-load condition. Such an adjustment can generally be attained by connecting path 655 to the gate terminal of transistor 390. Common mode feedback circuit 650 can be implemented in a known way.

It is helpful to understand the problems that lead to selection of Vlclamp. Accordingly, the problems are described first. An example problem that would be encountered with the common mode feed back circuit is described below.

Problem 8: Common mode feed back circuit 650 may be too slow to recover/adjust the common mode voltage of cascode amplifier 250 from over-load condition to normal operation when input signals inp and inm change back to normal operating range from over load condition. Thus, a voltage level outside of the normal operating range may be generated at outp 299 and outm 298 for a prolonged duration (e.g., several clock cycles), which may be unacceptable in several environments.

From the above, it may be appreciated that it is desirable to keep outp 299 between 1 and 2V in normal operation, however, outp 299 can change between 0V and 3.9V in the worst case, which may pose several problems. An embodiment of the present invention solves problem 8 by clamping outp 299 to a desired level by selecting proper voltage levels for Vlclamp as described below.

In the described example embodiment, Vhclamp needs to be less than or equal to the maximum permissible voltage associated with the operation of low voltage transistors. Vlclamp on the other hand, needs to be chosen such that the average of Vhclamp and Vlclamp equals a nominal common mode voltage, which ensures the appropriate operation of common mode feedback circuit 650. This in turn results in optimal recovery from over load condition since clamping output of amplifier 250 to desired levels may ensure the desired common mode voltage. In the illustrative example, Vlclamp is chosen to equal 0.6V when Vhclamp is 2.4V to maintain a common mode voltage of 1.5V.

The description is continued with reference to the operational characteristics of low clamping circuit 640 due to the operation of current amplifier 820 and transistor 810 with reference to FIG. 8B.

15. Voltage vs. Current (V-I) Characteristics of Low Clamping Circuit

FIG. 8B is a graph depicting V-I characteristics of low clamping circuit 620 in one embodiment. The voltage at outp 299 is represented on X-axis and the corresponding current drawn by low clamping circuit 620 is represented on Y-axis.

Vertical line 840 represents the characteristics of an ideal clamping circuit that is desirable. As may be readily observed, low clamping circuit 620 does not draw any current until point 841 (representing Vlclamp), but draws infinite amount of current when the voltage equals or below point 841.

Line 850 indicates the characteristics of low clamping circuit 620. Utmost negligible amount of current is drawn up to point 851. Point 851 approximately equals bias2, and thus has a value greater than Vlclamp 841. The increase of current is gradual as voltage on outp 299 decreases from point 851 until the voltage reaches Vlclamp 841, after which the increase in current is steep.

Due to such operation, low clamping circuit 620 clamps outp 299 to Vlclamp. The description is continued with reference to various example implementations of current amplifier 720.

16. Current Amplifiers

FIGS. 9, 10 and 11 are circuit diagrams illustrating the details of various example implementations of current amplifier 720. In particular, FIG. 9 is a circuit diagram illustrating the details of current amplifier 720 suitable for low frequency applications, FIG. 10 is a circuit diagram illustrating the details of current amplifier 720 suitable for high frequency applications, and FIG. 11 is a circuit diagram illustrating the details of current amplifier 720 suitable for moderately high frequency applications.

Continuing with reference to FIG. 9, current amplifier 720 is shown containing NMOS transistors 920 and 930, with the gate terminal of transistor 930 being connected to the drain terminal of transistor 920. The source terminals of the two transistors are connected to AVSS/ground. The drain terminals of transistors 920 and 930 are respectively connected to paths 711 and 722 respectively.

The gate terminal of transistor 920 is biased by bias3 voltage. Bias3 equals that voltage which when applied to gate of transistor 920 sets up the reference current for current comparator formed by transistors 920 and 710. The implementation of transistor 920 and the selection of bias3 voltage will be apparent to one skilled in the relevant arts by reading the disclosure provided herein.

Due to such a design, transistor 920 operates as a current comparator. When the voltage on outp 299 is lesser than Vhclamp, no (negligible amount of) current flows on path 711 (as described above with reference to transistor 710 of FIG. 7B). As a result, the voltage at node 923 is closer to AVSS, which turns off transistor 930. Thus, low current is drawn on line 722 when the voltage on outp 299 is less than Vhclamp.

When the voltage on outp 299 equals to Vhclamp, substantial amount of current flows on path 711, which increases the voltage at node 923. Transistor 930 is turned on as a result, and draws current on path 722. Thus, transistor 930 needs to be designed to draw high current on path 722 when on. Due to the drawing of such high current, outp 299 may be clamped to Vhclamp. Thus, current amplifier of FIG. 9 enables high clamping circuit 610 to clamp outp 299 to Vhclamp, as desired.

Current amplifier 720 of FIG. 9 may provide low parasitic capacitance since both transistors 920 and 930 are implemented as NMOS transistors (which inherently have lower parasitic capacitance compared to PMOS transistors), and also since the transistors need not be of large size. The description is continued with respect to an alternative embodiment of current amplifier 720.

FIG. 10 is a circuit diagram illustrating the details of current amplifier 720 in an alternative embodiment. Current amplifier 720 is shown containing NMOS transistors 1020 and 1030, with the gate terminal of transistor 1030 being connected to the drain terminal of transistor 1020. The source terminals of the two transistors are connected to AVSS/ground. The drain terminals of transistors 1020 and 1030 are respectively connected to paths 711 and 722 respectively. The drain and gate terminals of transistor 1020 are shorted.

Transistor 1030 is designed to be K times the size of transistor 1020. In an embodiment, the size of transistor 1030 equals the size of transistor 930. Transistor 1020 generates a bias such that the current on path 722 is K times the current on path 711 when outp 299 equals Vhclamp, as described below.

When the voltage on outp 299 is lesser than Vhclamp, no (negligible amount of) current flows on path 711 (as described above with reference to transistor 710 of FIG. 7B). As a result, the voltage at node 1023 is closer to AVSS, which turns off transistor 1030. Thus, low current is drawn on line 722 when the voltage on outp 299 is less than Vhclamp.

When the voltage on outp 299 equals to Vhclamp, current flows on path 711, which increases the voltage at node 1023. Transistor 1030 is turned on as a result, and draws current on path 722. As would be apparent to one skilled in the relevant arts, the larger size (K times) of transistor 1030 would cause the current on path 722 to equal K times the current drawn on path 711. Thus, current amplifier of FIG. 10 enables high clamping circuit 610 to clamp outp 299 to Vhclamp, as desired.

In addition, it may be appreciated that the embodiment of FIG. 10 is more suited for high frequency applications than the embodiment of FIG. 9. This is because the speed of response of respective current amplifiers is inversely proportional to the resistance at gate terminals of transistors 930 and 1030. The resistance at the gate terminal of transistor 930 equals the inverse of Gds (drain to source transconductance) of transistor 920, and the resistance at the gate terminal of transistor 1030 equals the inverse of transconductance Gm of transistor 1020. As Gm is generally much greater than (often 30–50 times)Gds, the current amplifier of FIG. 10 may operate at higher frequencies.

Current amplifier 720 of FIG. 10 may provide low parasitic capacitance since both transistors 1020 and 1030 are implemented as NMOS transistors. Even though transistor 1030 is of size K times that of transistor 1020, the total size may still be less compared to the prior transistor 705 for drawing similar amounts of current. In addition, since transistor 705 is implemented using PMOS (having inherently more parasitic capacitance) and transistor 1030 is implemented using NMOS, the total parasitic capacitance offered by transistor 1030 may be substantially less than that offered by transistor 705. The description is continued with reference to another alternative embodiment of current amplifier 720.

FIG. 11 is a circuit diagram illustrating the details of current amplifier 720 in an alternative embodiment. Current amplifier 720 is shown containing NMOS transistors 1120 and 1130, with the gate terminal of transistor 1130 being connected to the drain terminal of transistor 1120. The drain terminals of transistors 1120 and 1130 are respectively connected to paths 711 and 722 respectively. The drain and gate terminals of transistor 1120 are shorted. The source terminal of transistor 1130 is connected to AVSS/ground and the source terminal of transistor 1120 is connected to AVSS through resistor 1150.

It may be observed that current amplifier 720 shown in FIG. 11 is similar to FIG. 10 except that an additional resistor 1150 connected between the source of transistor 1120 and AVSS. Transistors 1120 and 1130 operate similar to transistors 1020 and 1030 respectively. Only the change in operation of current amplifier 720 of FIG. 11 due to resistor 1150 is described below for conciseness.

The voltage drop across resistor 1150 increases the gate voltage applied to transistor 1030, which increases the current on path 722. As a result, current on path 722 is much higher than K times the current on path 711. However, resistor 1150 adds to the resistance at gate terminal of transistor 1030, which increases the charging and discharging time. As a result, the current amplifier in FIG. 11 may operate at higher frequencies than the embodiment of FIG. 9, but at lower frequencies than the embodiment of FIG. 10.

Current amplifier 720 of FIG. 11 may provide low/acceptable parasitic capacitance for reasons similar to those described above with reference to FIG. 10. In addition, due to the use of resistor 1150, transistor 1130 may be of smaller size compared to transistor 1030 for drawing similar amount of current. As a result, current amplifier 720 of FIG. 11 may offer lower parasitic capacitance compared to that in FIG. 10 for similar requirements.

In addition, it may be noted that high clamping circuit 610 offers low parasitic capacitance at outp 299 since the size of transistor 710 of FIG. 7B need not be increased to draw more current and current amplifier 720 is implemented using NMOS transistors only, which offer low parasitic capacitance compared to PMOS transistors. The V-I characteristics of all the above three current amplifiers are described below with reference to FIG. 12.

FIG. 12 is a graph depicting the details of V-I characteristics of all the above three example implementations of the current amplifier. X-axis represents voltage on outp 299 and Y-axis indicates the current on path 722. Lines 1210, 1230, and 1250 represent the change in current on path 722 corresponding to current amplifiers of FIGS. 9, 10, and 11 respectively.

It may be observed that each of lines 1210, 1230 and 1250 starts rising from point 1201 (slightly less than Vhclamp) slowly and sharply after point 1202. Point 1202 represents the voltage level Vhclamp to which output 299 needs to be clamped. It may be further observed that high current flows on path 722 only when outp 299 increases beyond Vhclamp 1202 in all three cases.

However, lines 1210, 1230 and 1250 are shown increasing with different slopes. Line 1210 is shown increasing steeply. Line 1230 is shown increasing slowly compared to line 1210 since current on path 722 depends only on the size of transistor 1030. However, line 1250 is shown increasing faster than line 1230 and slower than line 1210 since current on path 722 depends on the size of transistor 1130 and voltage drop across resistor 1150 as described above.

It should be understood that only the implementation details of various embodiments of current amplifier 720 are described above for conciseness. However, the implementation of current amplifier 820 using similar principles will be apparent to one skilled in the relevant arts. Broadly, the NMOS transistors in FIGS. 9–11 need to be replaced by PMOS transistors, the source terminals need to be connected to AVDD, and the drain terminals of the PMOS transistors need to be connected to paths 711 and 722 respectively.

The description is continued with reference to the desired characteristics of clock signal 411.

17. Clock Level Selection

As described above with reference to FIG. 4C, clock signal 411 is connected to the gate terminal of transistor 410. In general, a high voltage of clock signal 411 provides a high drive, which leads to faster operation of transistor 410 when transistor 410 is selected as an NMOS transistor. However, the voltage level needs to be selected such that the cross-terminal voltages do not violate the corresponding maximum permissible voltages.

In an embodiment described below, the clock signal is generated using high (vclk1) and low (vclk2) voltages of 2.5 V and 0.5 V respectively. By using 2.5 V for the high level, a high drive strength is achieved. In addition, as noted above, the difference of voltage levels representing low and high levels of the clock signal needs to be selected to be within the maximum permissible voltage levels (2.4 in the illustrative example) permitted by the low voltage transistors. Thus, 0.5 V satisfies such a criteria.

The choice of the above voltage levels is within the specifications for the low voltage transistors. When the clock signal is at 2.5 V, the $V_{GS}$ of transistor 410 has a maximum value of 1.9 V (2.5–0.6), and a minimum value of 0.1 V (2.5–2.4), which are both within the permissible levels. When the clock signal is at 0.5 V, $V_{GS}$ of transistor 410 has a maximum value of 1.9 V (2.4–0.5), and a minimum value of 0.1 V (0.6–0.5), which are both again within the permissible levels. This is because of the fact that outp 299 is clamped to 2.4V as the upper limit and 0.6V as the lower limit.

Due to the use of a higher voltage level (2.5 Volts) for the clock signal, higher drive strength is conveniently attained. As may be appreciated, the clamping of the output terminals to 0.6 V minimum value, facilitates the use of such higher voltage levels. The description is continued with example embodiments enabling the generation of such a clock signal.

Figure 14:
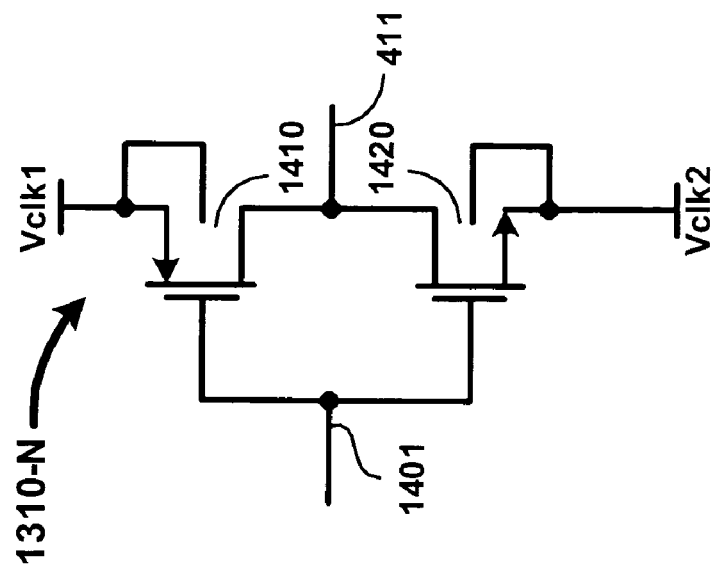
FIG. 14 is a circuit diagram illustrating the manner in which an inverter used in a clock generator is implemented in one embodiment.
Figure 13:
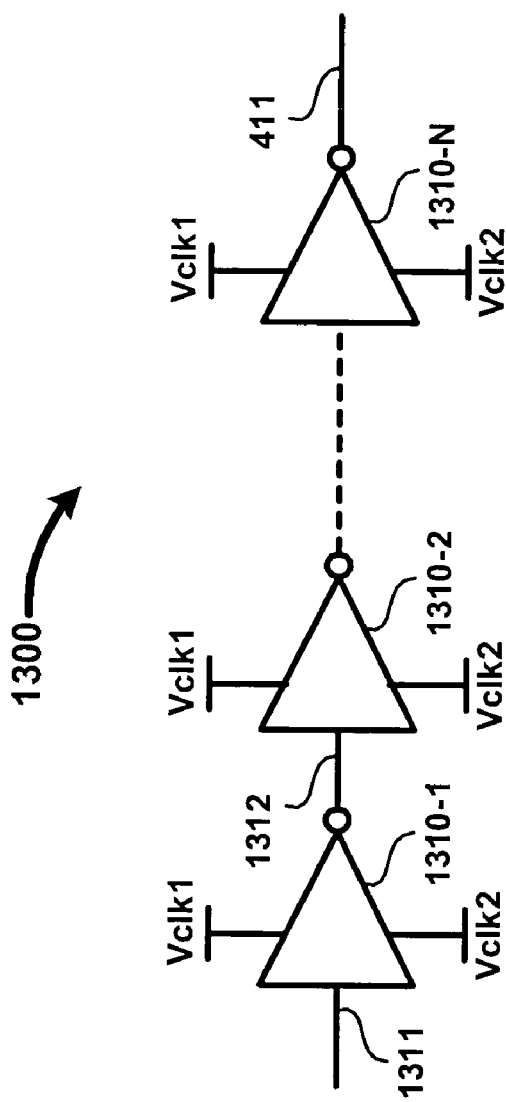
FIG. 13 is a circuit diagram illustrating the details of a clock generator in one embodiment of the present invention.

FIGS. 13 and 14 are circuit diagrams together illustrating the manner in which a clock signal having a high voltage (vclk1) of 2.5 V and a low voltage (vclk2) of 0.5 V is generated in an embodiment of the present invention. In particular, FIG. 13 is a diagram illustrating the implementation details of clock generator 1300 which generates clock signal 411, and FIG. 14 is a circuit diagram illustrating the details of an inverter used in the embodiment of FIG. 13.

Continuing with reference to FIG. 13, clock generator 1300 is shown containing N-inverters 1310-1 though 1310-N, which are connected in sequence. Each of inverters 1310-1 through 1310-N receive voltage levels of Vclk1 and Vclk2 as supply and ground respectively. In the example illustration, Vclk1 and Vclk2 are 2.5V and 0V respectively.

Inverter 1310-1 may receive a clock signal on path 1311 with high and low voltage levels of 3.3V (3.9V in worst case) and 0V respectively. The clock signal on path 1311 represents a normal clock signal which may be otherwise generated for various other components of the high voltage environment Inverter 1310-1 generates a clock signal on path 1312 with a desired high and low voltage levels of 2.5V and 0.5V by receiving the normal clock signal on path 1311.

Each of inverters 1310-2 through 1310-N drives various components of the high voltage environment with the desired clock signals since inverter 1310-1 alone may not be able to drive all the components. For example, inverter 1310-N drives transistor 410 with the desired clock signal on path 411. The output of inverter 1310-N on path 411 represents the desired clock signal with a desired high and low voltage levels of Vclk1 2.5V and Vclk2 0.5V respectively.

In an embodiment, each of inverters 1310-2 through 1310-N is implemented using low voltage transistors, which enables the desired clock signal to be generated in a short duration (since low voltage transistors provide high speed operation). The voltage levels representing low and high levels of the clock signal need to be selected to be within the maximum permissible voltage (2.4 in the illustrative example) due to the use of low voltage transistors. Inverter 1310-1 is implemented using high voltage transistors since the high voltage level of normal clock signal on path 1311 is greater than 2.4V. However, inverter 1310-1 may also be implemented using low voltage transistors if the high voltage level of clock 1311 is less than 2.4V. The manner in which in verter 1310-N provides a clock signal with desired voltage levels on path 411 to drive transistor 410 is described below.

FIG. 14 is a circuit diagram illustrating the details of inverter 1310-N in one embodiment. As noted above, inverter 1310-N provides a clock signal with desired voltage levels on path 411 and also illustrates some additional considerations in choosing the voltage levels (Vclk1 and Vclk2) of the clock signal. Inverter 1310-N is shown containing PMOS transistor 1410 and NMOS transistor 142 0. Transistors 1410 and 1420 are also chosen as low voltage transistors for higher speed of operation.

Each of transistors 1410 and 1420 receives a clock signal on path 1401 on the respective gate terminal. When clock signal 1401 is at low voltage level, transistor 1410 turns on (and transistor 1420 turns off) to provide a high voltage level of Vclk1 on path 411. When the clock signal 1401 is at high voltage level, transistor 1410 turns off and transistor 1420 turns on to provide a low voltage level of Vclk2 on path 411.

As a result, the clock signal on path 411 changes with low and high voltage levels of Vclk2 of 0.5V and Vclk1 of 2.5V respectively. By generating such a clock signal, the drive strength of transistor 410 may be enhanced (compared to a scenario when 0V and 2.0 V are used for vclk2 and vclk1 respectively). In addition, the 0.5V/2.5 V based implementation avoids the following two problems that may otherwise result from the use of 0V/2.5V.

Problem 9: $V_{GS}$ of transistor 1410 would be −2.5V when clock on path 1401 is at low level (0V) since gate of transistor 1410 is at 0V and source of transistor 1410 is connected to high voltage of 2.5V. The 2.5V voltage level is undesirable since it exceeds the maximum permissible voltage level of 2.4V.

Problem 10: $V_{GS}$ of transistor 1420 would be 2.5V when clock on path 1401 is at high level (2.5V) since gate of transistor 1420 is at 2.5V and source of transistor 1410 is connected to low voltage of 0V. The 2.5V voltage level is undesirable since it exceeds the maximum permissible voltage level of 2.4V.

In the case of 0.5V/2.5V implementation noted above, transistors 1410 and 1420 receive a maximum $V_{GS}$ of 2V which is less than 2.4V, as desirable. Also, by connecting the bulk terminals of transistors 1410 and 1420 as shown, the $V_{DB}$ of the transistors is also within 2V. Thus, the cross-terminal voltages are constrained to less than or equal to the maximum permissible voltage of the low voltage transistor. The description is continued with the considerations when clock signal stops changing from one level to another level.

18. Clock Stoppage

In general, it is desirable that the clock signal be changing with the desired time period for a proper operation of the circuits. It is helpful to understand first the problems posed when clock signal stops changing in a high voltage environment containing low voltage transistors. The corresponding solutions according to various aspects of the present invention are then described.

One problem with clock stoppage is that low voltage transistors may receive maximum/high permissible voltage level for a long time even with the use of clamping circuit 600 of FIG. 6A. For example, in FIG. 6B, common mode feed back circuit 650 stops operating when clock stops. The non-operation of circuit 650 may cause outputs outp 299 and outm 298 to reach high voltage levels (e.g. 3.9V), which is undesirable due to the presence of low voltage transistor.

Even if clamping circuit 600 clamps outp 299 and outm 298 to 2.4V, low voltage transistors (e.g. 320, 340, 350, 370 and 410) may receive maximum permissible voltage (safe voltage) of 2.4V for a long time duration, which may reduce the life-time of the transistors. An approach to avoid such undesirable effects is described below with reference to FIGS. 15, 16, and 17.

Figures 15, 16:
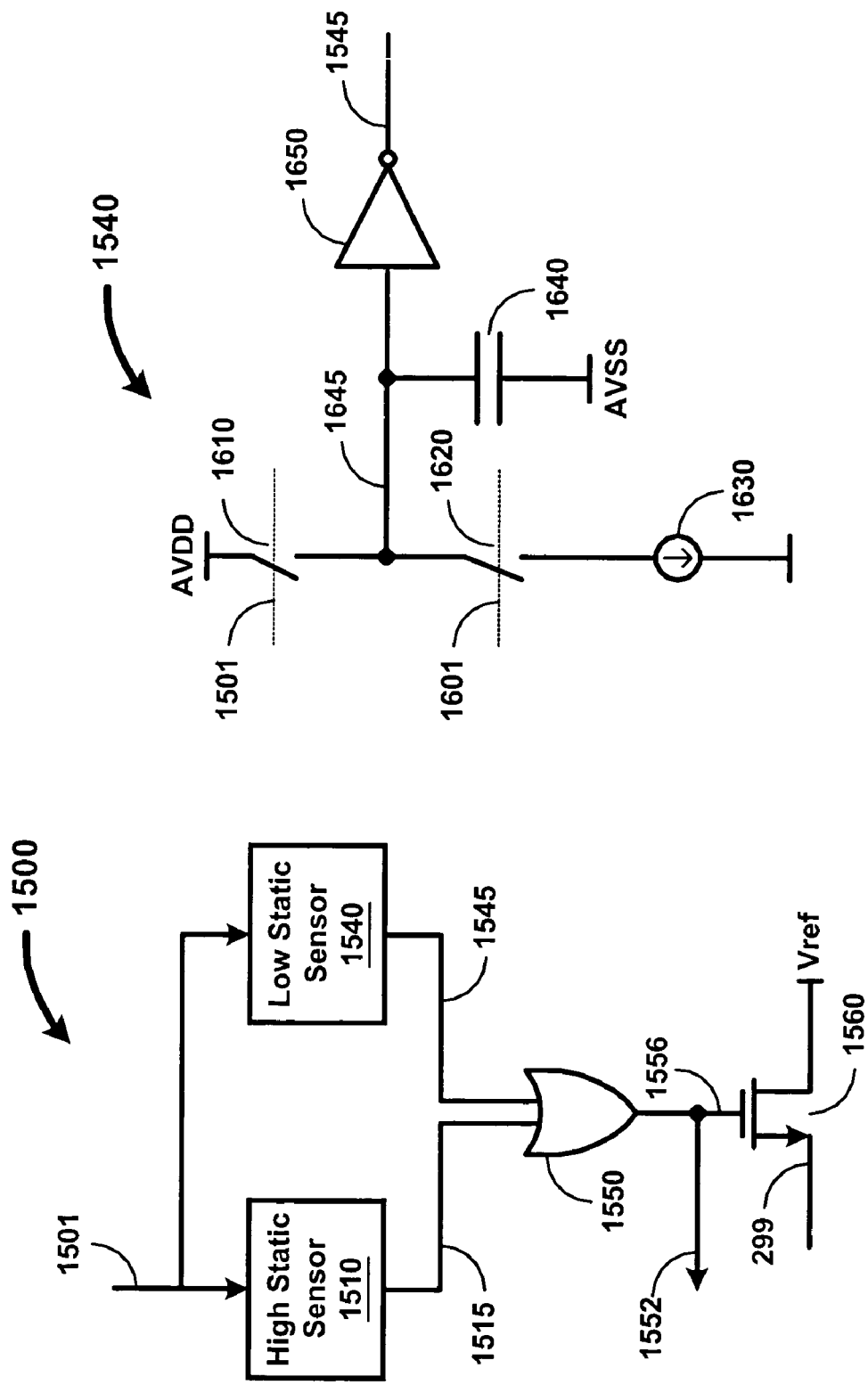
FIG. 15 is a block diagram illustrating the details of a clock freeze protect circuit in an embodiment of the present invention.
FIG. 16 is a circuit diagram illustrating the details of a low static sensor contained in the clock freeze protect circuit in one embodiment of the present invention.
Figure 17:
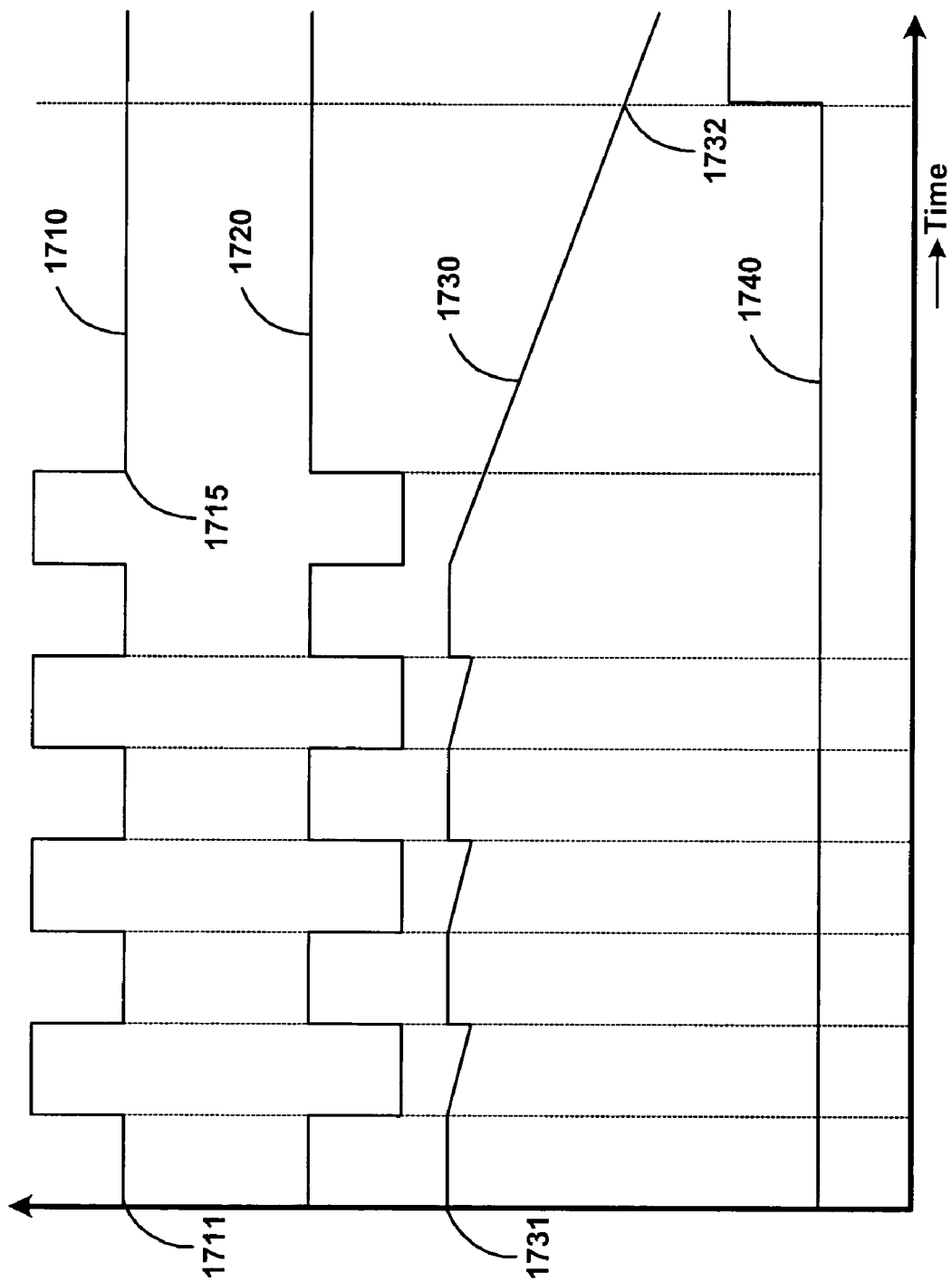
FIG. 17 is a timing diagram depicting the details of various signals in the low static sensor in one embodiment.

In particular, FIG. 15 is a block diagram illustrating the details of clock freeze protect circuit 1500, which determines whether a clock signal has stopped and pulls the voltage on outp 299 and outm 298 to a safe voltage (1.5V). FIG. 16 is a circuit diagram illustrating the details of a low static sensor implemented in clock freeze protect circuit 1500, and FIG. 17 is a timing diagram depicting the details of various signals in the low static sensor.

FIG. 15 is block diagram illustrating the details of clock freeze protect circuit 1500 in an embodiment of the present invention. Clock freeze protect circuit 1500 is shown containing high static sensor 1510, low static sensor 1540, OR gate 1550, and NMOS transistor 1560. Each component is described below.

High static sensor 1510 generates one logic level when clock signal 1501 is operational (i.e., changing levels periodically), and another logic level when clock signal on path 1501 remains at a high logical level. For illustration, it is assumed that high static sensor 1510 generates on path 1515 a value of 0 when clock signal on path 1501 is operational, and 1 when clock signal on path 1501 remains at a high logical level.

Low static sensor 1540 generates one logic level when clock signal 1501 is operational (i.e., changing levels periodically), and another logic level when clock signal on path 1501 remains at a low logical level. For illustration, it is assumed that low static sensor 1540 generates on path 1545 a value of 0 when clock signal on path 1501 is operational, and 1 when clock signal on path 1501 remains at a low logical level.

OR gate 1550 performs a logical OR operation of the values received on paths 1515 and 1545, and thus generates a logic 0 to indicate that the clock signal is operational and 1 to indicate that the clock signal is stuck at either 0 or 1. The output of OR gate 1550 is provided on path 1556, and may be referred to as a stuck-at signal since the signal indicates whether the clock signal is stuck at 0 or 1.

Transistor 1560 is shown with source terminal connected to outp 299, gate terminal connected to path 1556, and drain terminal connected to a reference voltage (Vref). Transistor 1560 is switched off when logic 0 (when clock 1501 is changing) is received on path 1556 and switched on when logic 1 (when clock 1501 freezes) is received on path 1556. When in on state, path 299 is connected to Vref, causing the voltage on path 299 to be maintained at Vref. In an embodiment, Vref is chosen as 1.5V, which is much less than maximum permissible voltage of 2.4V and thus more acceptable voltage may be applied across the terminal of low voltage transistors.

The signal on path 1552 (equals the signal on path 1556) is used to tri-state cascode amplifier 250 such that outp 299 may not be driven by the amplifier when clock 1501 is stuck at 0 or 1. The manner in which signal 1552 can be used to tri-state amplifier 250 will be apparent to one skilled in relevant arts.

In addition, the output of clock freeze protect circuit 1500 on path 1556 can be used to power-down some of the circuits (e.g. the circuits which are non-operative when clock stops) or shut-off the device (if entire device is non-operative) in the high voltage environment. As a result, the power consumed by the device may be reduced. The manner, in which low static sensor 1540 may be implemented is described below.

19. Low Static Sensor

FIG. 16 is a circuit diagram illustrating the details of low static sensor 1540 in an embodiment of the present invention. Low static sensor 1540 is shown containing switches 1610 and 1620, current source 1630, capacitor 1640 and inverter 1650. Each component is described below.

Switches 1610 and 1620 receive clock signal 1501 and inverted clock signal of 1501 on path 1601 respectively. Switch 1 610 is in open state when clock 1501 is at low logic level and in closed state otherwise. Similarly, switch 1620 is in open state when clock 1501 is at high logic level and in closed state otherwise. In general, only one switch is in closed state and the other switch is in open state at any given moment.

Capacitor 1640 charges to AVDD when switch 1610 is in closed state and discharges through current source 1630 when switch 1620 is in closed state. It may be observed that capacitor 1640 charges abruptly to AVDD due to the use of the voltage source. However, the rate of discharge can be controlled by appropriate design of current source 1630.

Inverter 1650 inverts a data bit represented by the voltage level present on capacitor 1640 (on path 1645), and provides the result on path 1545. When the clock is operational, the voltage level continues to be high, and thus a 0 value is provided on path 1545. However, when the clock signal is stuck at low level for a substantial duration, the voltage level drops below the voltage level representing 0, and thus an output of 1 is generated when the clock signal is stuck at 0.

Current source 1630 supplies the required current to discharge capacitor 1640. The amount of current supplied determines the rate of discharge of capacitor 1640, which in turn determines the specific time point at which value on path 1545 changes to 1 once the clock signal is stuck at 0. The operation of all the components of low static sensor 1540 is illustrated in further detail below.

In operation, when clock signal 1501 is changing (not stopped), capacitor 1640 charges in very quickly (e.g., in one clock cycle) in one phase of the clock cycle, and discharges only a small amount in the other phase. Due to the high resulting voltage present on capacitor 1640, inverter 1650 provides a 0 on path 1545.

When clock signal 1501 is stuck at a low logical level, capacitor 1640 discharges slowly, causing the voltage level present across capacitor 1640 to decrease slowly. The voltage eventually reaches a threshold level, which causes inverter to change the output value on path 1545 from 0 to 1, as desired.

It may be noted that, low static sensor 1540 provides a logic 1 when clock signal is stuck at low logical level and a logic 0 otherwise (including when the clock signal is stuck at 1). The signal changes on various paths of low static sensor 1540 are illustrated in further detail below with reference to FIG. 17.

FIG. 17 is a timing diagram illustrating the details of various signal changes in low static sensor 1540. Lines 1710, 1720, 1730 and 1740 respectively represent clock 1501, inverted clock 1601, voltage level on path 1645, and output of low static sensor 1540 on path 1545.

Clock 1501 (Line 1710) is shown operational (with appropriate periodic transitions) between time points 1711 and 1715 and is shown stuck at low logical level starting at time point 1715. Line 1720 is inverted of line 1710.

Line 1730 is shown going down gradually in one phase of each clock cycle between time points 1711 and 1715, reflecting the slow discharge of capacitor 1640. Line 1730 is shown returning quickly to voltage level 1731 at the beginning of the other phase, reflecting the charging to AVDD quickly.

Line 1730 is shown going down gradually (without returning to voltage level 1731) starting at time point 1715 (until the voltage level reaches a low logical level indicated by time point 1732), reflecting the continuing discharge (without charging) due to the operation of current source 1630 alone.

Line 1740 is shown at low logical level till time point 1732 and is shown rising to high logical level at time point 1732, which indicates clock signal 1501 is stuck at low logical level. Thus, a logical value of 1 on path 1545 indicates that the clock signal is stuck at 0 for a sufficiently long duration.

It should be understood that only the implementation details of low static sensor 1540 are described above for conciseness. However, the implementation of high static sensor 1510 will be apparent to one skilled in the relevant arts by reading the disclosure provided herein. The description is continued with reference to ensuring that clamping circuit 600 is operational before high voltage potentially appears on outp 299 or outm 298;

20. Ensuring Clamping Circuit is Operational Before High Voltage Appears on Outp/Outm As may be appreciated it is desirable that clamping circuit 600 is operational before high voltage potentially appears on outp 299 or outm 298. Otherwise, the high voltage may damage (e.g., decrease the life-time of) the low voltage transistors.

One reason that clamping circuit 600 may be non-operational is when supply voltage is ramping up. As is well known in the relevant arts, a voltage source provides supply voltage AVDD (constant voltage) used in the operation of various circuits. As shown above with reference to FIG. 1, path 101 provides the supply voltage AVDD. However, in situations such as when a device (containing the voltage source) is turned on, the voltage level changes from 0 to AVDD, and problems may be presented to the approaches/circuits described above.

Figure 18B:
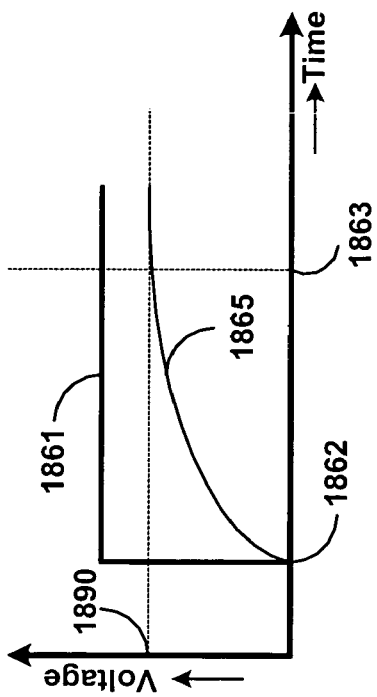
FIG. 18B is a timing diagram depicting the details of a supply voltage and target voltage as a function of time in one embodiment.
Figure 18A:
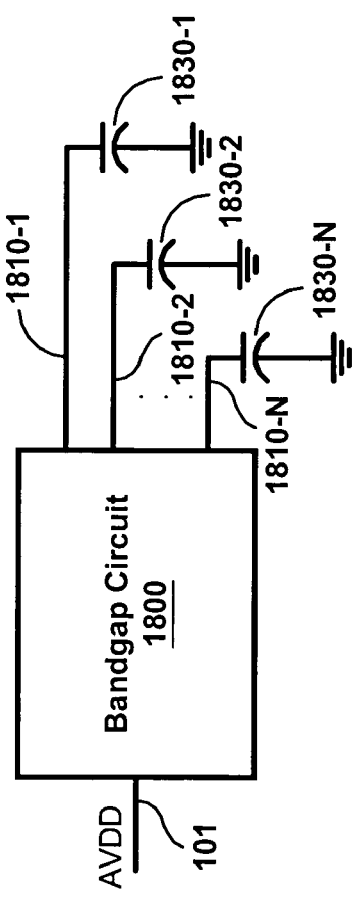
FIG. 18A is a block diagram illustrating the details of a band-gap circuit which generates various target voltages from a supply voltage in one embodiment.
Figure 19:
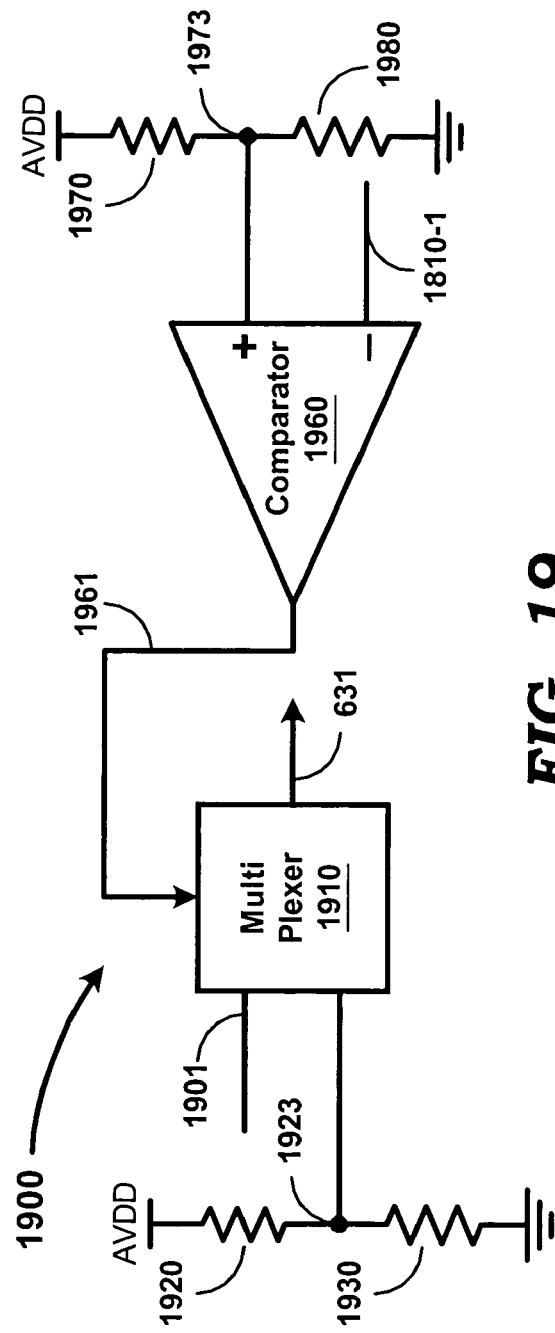
FIG. 19 is a circuit diagram illustrating the details of a clamp bias selection which is used for generating a bias voltage for a clamping circuit in an embodiment of the present invention.

FIGS. 18A, 18B, and 19 are diagrams together illustrating a source of various problems and their solutions when the voltage on path 101 ramps up from 0V to AVDD. In particular, FIGS. 18A and 18B illustrate the source of problems and FIG. 19 illustrates the corresponding solution in an embodiment of the present invention. First, the problems are described with reference to FIGS. 18A and 18B.

FIG. 18A is a block diagram illustrating the details of band-gap circuit 1800, which receives supply voltage on path 101 and generates several target voltages on paths 1810-1 through 1810-N. The load offered by each of the circuits is represented by capacitors 1830-1 through 1830-N, which are shown connected to paths 1810-1 through 1810-N respectively. One feature with such generation is that all the target voltages on paths 1810-1 through 1810-N may not change immediately when supply voltage on path 101 changes as further described below with reference to FIG. 18B.

FIG. 18B is a timing diagram depicting the details of supply voltage (Y-axis) on path 101 and target voltage 1810-1 as a function of time (X-axis). Lines 1861 and 1865 represent voltage levels on supply voltage on path 101 and target voltage 1810-1 respectively. It may be observed that supply voltage on path 101 is changing from low to a high level (AVDD) at time point indicated by 1862, and target voltage 1810-1 is not changing to target level 1890 immediately, but is gradually reaching target voltage 1890 (or a desired high fraction thereof) at time point indicated by 1863. The gradual change is because of the load capacitance offered by capacitors 1830-1 through 1830-N.

One problem with such gradual change is that the state of various circuits using a target voltage may not be accurate (voltages at various nodes may change undesirably) while the target voltage is increasing (up to time point 1863). For illustration, as described above, clamping circuit 600 of FIG. 6A clamps the voltage levels to desired voltage, however, a target voltage may be used to generate bias1 631 and bias2 642. The gradual change in the target voltage may cause undefined/unstable (or otherwise undesirable) state of clamping circuit 600 itself since clamping circuit 600 may not receive accurate bias voltage in the time duration between points 1862 and 1863.

The non-operation (or improper operation) of clamping circuit 600 may expose low voltage transistors to unacceptably high voltages (thereby damaging low voltage transistors), which is undesirable. The manner in which such exposure may be avoided is described below with reference to FIG. 19.

21. Clamp Bias Selection

FIG. 19 is a circuit diagram illustrating the manner in which exposure of low voltage transistors to high voltages due to non-operation of clamping circuit 600 may be avoided according to an aspect of the present invention. The circuit of FIG. 19 may be viewed as being contained within high clamping bias circuit 630, and thus clamp bias selection 1900 is described as generating bias4 voltage 631.

For illustration, it is assumed that voltage 1810-1 represents a target voltage which is likely to rise slowest among all the target voltages 1810-1 through 1810-N. In addition, a voltage divider containing resistors 1970 and 1980 is designed to generate (using AVDD) at node 1973 a pre-specified fraction (e.g., ½) of the voltage expected in steady state on target voltage 1810-1.

Comparator 1960 generates signal 1961 indicating whether the voltage at node 1973 is greater than voltage 1810-1 or not. In other words, signal 1961 is at one logical value until target voltage 1810-1 ramps up to voltage at node 1973, and at the other logical value thereafter.

Signal 1901 represents a voltage signal, which would be otherwise provided as a bias to high clamping circuit 610 if clamp bias selection 1900 were not used. Thus, signal 1901 may be generated in a known way. A voltage divider containing resistors 1920 and 1930 is designed to generate (at node 1923) a desired voltage.

Multiplexor 1910 selects either signal 1901 or signal on 1923 as specified by the value on path 1961. The selected signal is provided as input 631 to high clamping circuit 610. As the voltage at node 1923 would be selected during or soon after supply ramp up (when signal 1901 is still in undefined state), a proper bias voltage may be provided on path 631 since voltage at node 1923 is well determined as a fraction of supply voltage AVDD.

Assuming that the voltage provided on node 1 923 is sufficient to ensure the proper operation of high clamping circuit 610, the high clamping circuit would be operational immediately after the voltage supply provides AVDD. Accordingly, the problems noted above while a target voltage ramps up, are avoided. Another feature of the present invention protects low voltage transistors from exposure to higher voltages in other types of situations, as described below.

22. Preventing Exposure to High Voltages in Another Scenario

Another scenario in which it may be necessary to provide improvements to prevent exposure of low voltage transistors to high voltage, is described below with reference to FIGS. 20 and 21. FIG. 22 contains the corresponding improvements in one embodiment.

Figure 20:
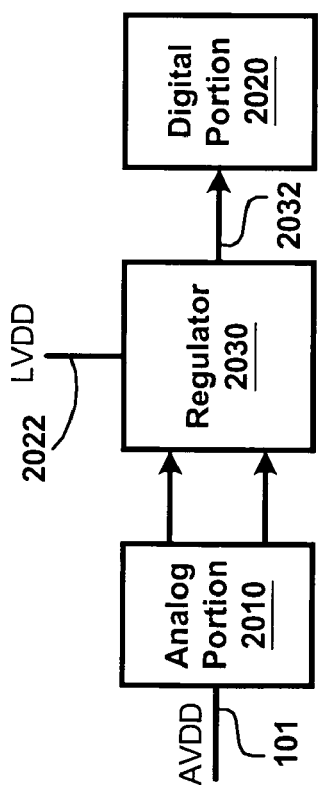
FIG. 20 is a block diagram illustrating the details of a mixed signal environment illustrating another environment in which it is desirable to provide improvements to prevent exposure of low voltage transistors to high voltage.

FIG. 20 is a block diagram illustrating the details of a mixed signal environment illustrating another environment in which it is desirable to provide improvements to prevent exposure of low voltage transistors to high voltage. The environment is shown containing analog portion 2010, digital portion 2020, and regulator 2030.

Analog portion 2010 contains the analog circuit portion of the mixed signal circuit of FIG. 20. Analog portion 2010 is assumed to generate one or more voltages and currents (using AVDD) required for the proper operation of regulator 2030, as described below.

For illustration, it is assumed that digital portion 2020 contains low voltage transistors, and is shown receiving voltage on path 2032. At least to avoid exposure of low voltage transistors to high voltage, it is desirable to ensure that high voltage is not present on path 2032.

Regulator 2030 is designed to receive high voltage supply LVDD 2022 and generate (during steady state) a regulated voltage (on path 2032) (which is less than the maximum permissible voltage of low voltage transistors (e.g. 2.4V)) to drive digital portion 2020. Regulator 2030 may require reference voltage and current to generate the regulated voltage.

The reference voltage and currents are received from analog portion 2010. The regulated voltage on path 2032 may reach an undesirable state when LVDD 2022 ramps up before AVDD 101 ramps up as described below with reference to FIG. 21.

Figure 21:
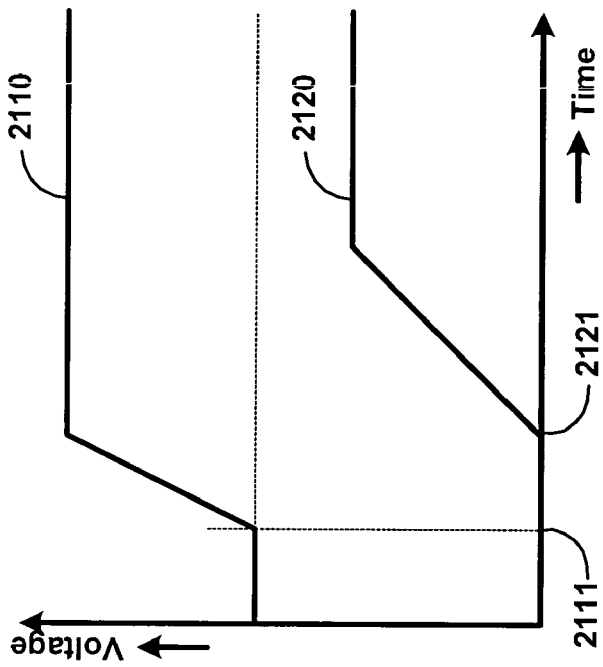
FIG. 21 is a timing diagram illustrating the manner in which a regulated voltage may reach an undesirable state when the high voltage has not yet ramped up to a desirable voltage level.
Figure 22:
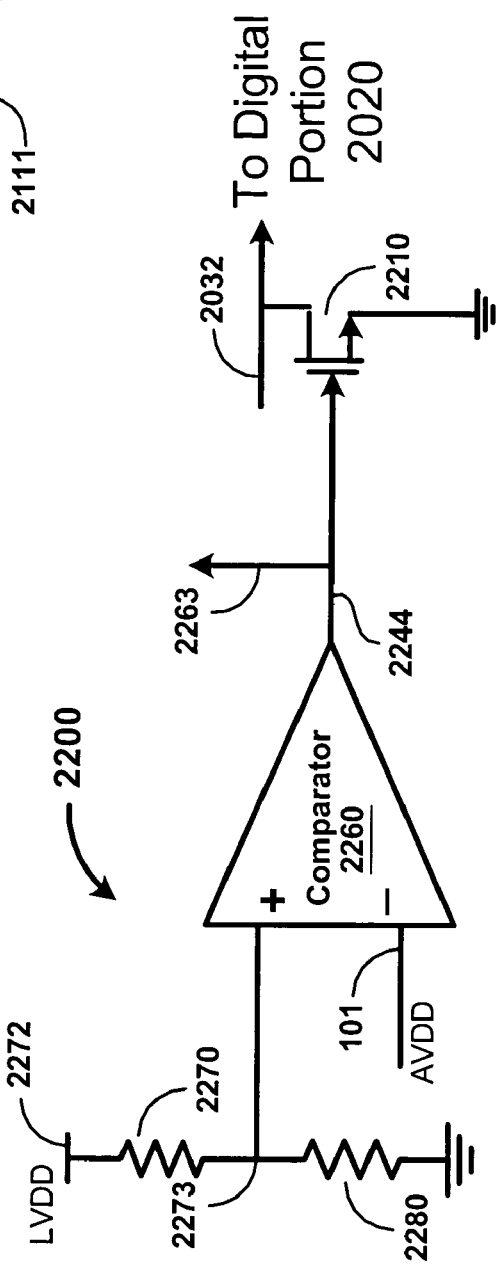
FIG. 22 is a circuit diagram illustrating the details of a supply sequencing adjusting circuit which ensures that low voltage transistors are not exposed to high voltage when a regulated voltage reaches an undesirable state in an embodiment of the present invention.

FIG. 21 is a timing diagram illustrating the manner in which voltage on path 2032 may reach an undesirable state. Lines 2110 and 2120 represent LVDD 2022 and AVDD 101 respectively. It may be observed that line 2110 is ramping up at time point 2111, and line 2120 is ramping up at time point 2121 after some delay from time point 2111. Voltage on path 2032 might be in an undefined state between time points 2111 and 2121.

One problem with the delay in ramping up is that an undesirable voltage may be presented on path 2032 since the reference voltage and currents from analog portion 2010 may not be accurate. For example, a high value (greater than 2.4V) on path 2032 damages low voltage transistors in digital portion 2020. One approach to address such problem is described below with reference to FIG. 22.

FIG. 22 is shown containing NMOS transistor 2210, resistors 2270 and 2280, and comparator 2260, which together operate as supply sequencing adjusting circuit 2200. NMOS transistor 2210 receives a pull down signal on gate terminal 2244 and source terminal is connected to ground. When pull down 2244 is 0, NMOS transistor 2210 is off and releases path 2032 from connecting to ground. As a result, the voltage generated by regulator 2030 is presented to digital portion 2020.

When pull down signal 2244 is 1, NMOS transistor 2210 turns on and connects path 2032 to ground, which ensures that high voltage is not presented as an input to digital portion 2020. Accordingly, it may be appreciated that an appropriate value of pull down signal 2244 prevents high voltage from being applied as an input to digital portion 2020. The manner in which pull down signal 2244 may be generated is described below.

Resistors 2270 and 2280 together operate as a voltage (LVDD 2022) divider circuit. The values of resistors are selected in such away that the voltage at node 2273 represents the desired voltage level of AVDD at which regulator 2030 may receive proper reference voltage and currents. In one embodiment, the voltage at node 2273 equals ⅔ of LVDD 2022.

Comparator 2260 compares the voltage at node 2273 received on one terminal and AVDD 101 received on other terminal, and provides the comparison result as pull down signal on path 2244. Comparator 2260 generates on path 2244 a logic 1 when AVDD 101 is smaller than the voltage on node 2273 and 0 otherwise. As a result, transistor 2210 pulls path 2032 to ground when AVDD has not yet ramped up sufficiently, and avoids exposing the low voltage transistors in digital portion 2020 to high voltage.

In addition, the signal on path 2263 (equals the signal on path 2244) is used to tri-state regulator 2030 such that the regulated voltage on path 2032 may not be driven to a high voltage when AVDD has not yet ramped up sufficiently. The manner in which signal 2263 may be used to tri-state regulator 2030 will be apparent to one skilled in relevant arts.

From the above, it may be observed that several problems are encountered by including low voltage transistors in a high voltage environment. The solutions to some of such problems are described above. The consolidated view of all the solutions is described below with reference to FIG. 23 merely for ease of understanding.

23. Consolidated Structure

Figure 23:
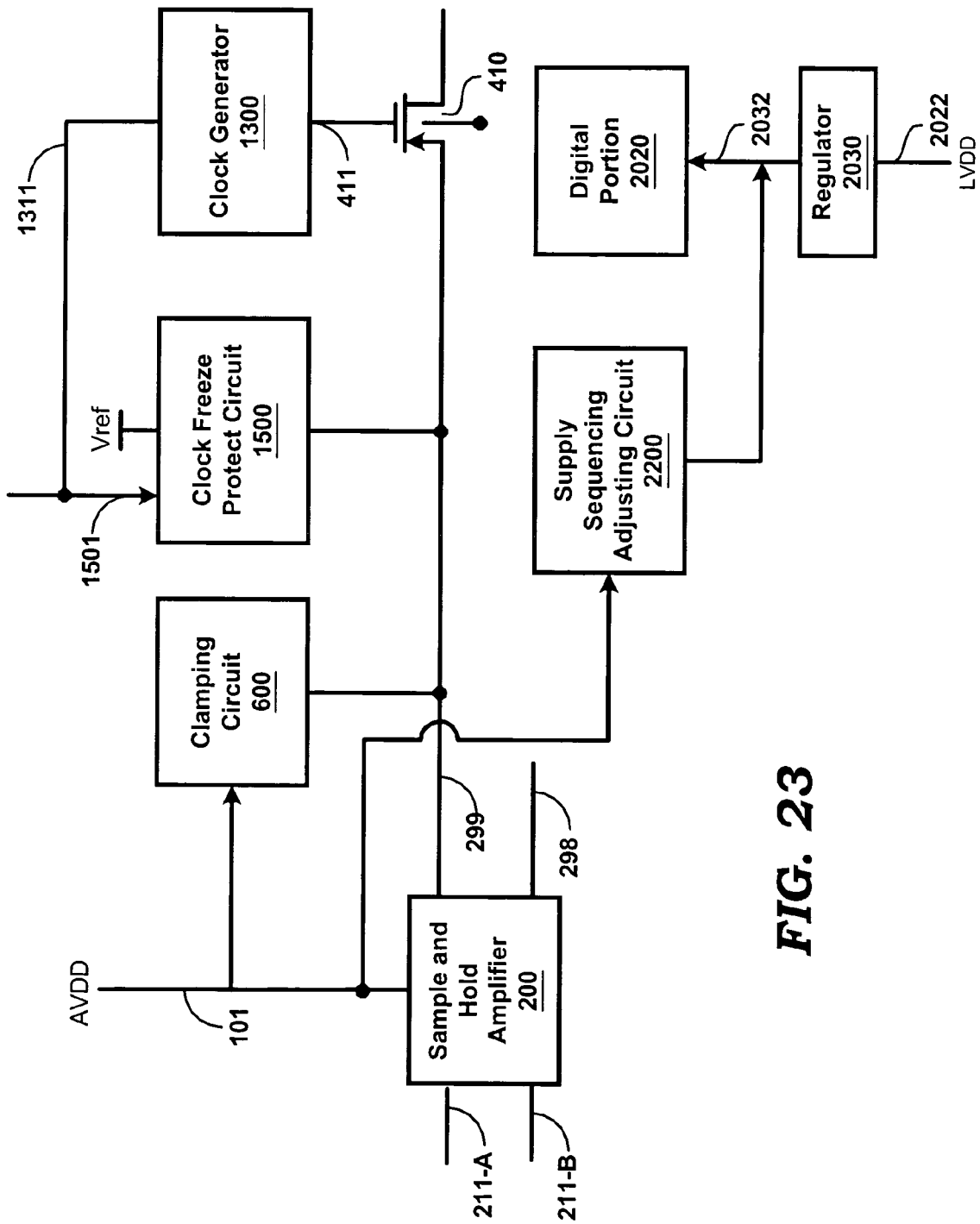
FIG. 23 is a block diagram illustrating the details of a consolidated structure of different improvements provided according to various aspects of the present invention.

FIG. 23 is a block diagram illustrating the details of a consolidated structure of all the above proposed solutions in an embodiment of the present invention. The consolidated structure is shown containing sample and hold amplifier (SHA) 200, clamping circuit 600, clock generator 1300, clock freeze protect circuit 1500, supply sequencing adjusting circuit 2200, regulator 2030, and digital portion 2020. Each component is described below in detail.

Clamping circuit 600 clamps output 299 of sample and hold amplifier 200 to the desired voltage level as described above with reference to FIG. 6A. When clamping circuit 600 is operational, low voltage transistors receive a voltage within the maximum permissible value. For example, in the case of a 1.8V transistor, clamping circuit 600 clamps outp 299 to 2.4V at high level, and to 0.6V at low level as required by specifications in one embodiment.

By ensuring that clamping circuit 600 operates accurately, low voltage transistors may not be exposed to high voltages. As described above with reference to FIG. 19, even during ramp up of AVDD, clamping circuit 600 is designed to be operate accurately.

Clock freeze protect circuit 1500 detects the state of clock signal 1501, and connects outp 299 to Vref when the clock signal is stuck at 0 or 1. Vref (e.g. 1.5V) is generally at a lower voltage level compared to clamp voltage of 2.4V. As a result, low voltage transistors are in safe operating condition (i.e., not exposed to high voltage) when clock signal is not active (changing) for a long time. In addition, when clock freeze protect circuit 1500 pulls the voltage on outp 299 to 1.5 V (Vref), clamping circuit 600 would be rendered inactive since the voltage on outp 299 is less than 2.4 V (maximum permissible voltage for low voltage transistors) and greater than 0.6V by appropriate choice of Vref.

Clock generator 1300 generates a clock signal with desired high and low voltage levels on path 411 using a clock signal on path 1311, which is same as clock on path 1501. Clock signal 411 drives low voltage transistor 410 with high drive strength for faster operation. In one embodiment, the high and low levels of clock 411 are generated equaling 2.5V (i.e., greater than the maximum voltage for which low voltage transistors are designed) and 0.5V respectively. The use of such voltage levels ensures that only permissible voltage levels are applied across the terminals of low voltage transistors.

Supply sequencing adjusting circuit 2200 ensures that undesirably high voltage is not provided to digital portion 2020 on path 2032, for example, when LVDD changes faster than AVDD. Supply sequencing adjusting circuit 2200 pulls the voltage level on path 2032 to ground until AVDD reaches a fraction of LVDD, and then releases line 2032. In such a released state, the voltage supplied by regulator 2030 (other connections to regulator 2030 shown only in FIG. 20) is provided to digital portion 2020 on path 2032.

For illustration, all the approaches are described above with reference to path outp 299, however, similar components are used on path outp 298 to clamp outp 298 also to the desired voltage level. In addition, the approaches of above may be used at several nodes in a high voltage environment containing low voltage transistors.

Furthermore, though the approaches are described with reference to high and low voltages which correspond to the nominal/acceptable voltage for which the high voltage transistors and low voltage transistors are designed for, it should be appreciated that several aspects of the present invention are applicable to using various combinations of low/higher combinations depending on the specific requirements of the implementation.

In addition, due to the techniques used, the low voltage transistors are operated without having to use voltage regulators between the high supply and the terminals of the low voltage transistor. As is well known, a voltage regulator generally refers to an apparatus which generates a lower voltage from a higher voltage input signal.

In general, the approaches described above can be implemented in various devices. The description is continued with reference to an example device in which various aspects of the present invention can be implemented.

24. Example Device

Figure 24:
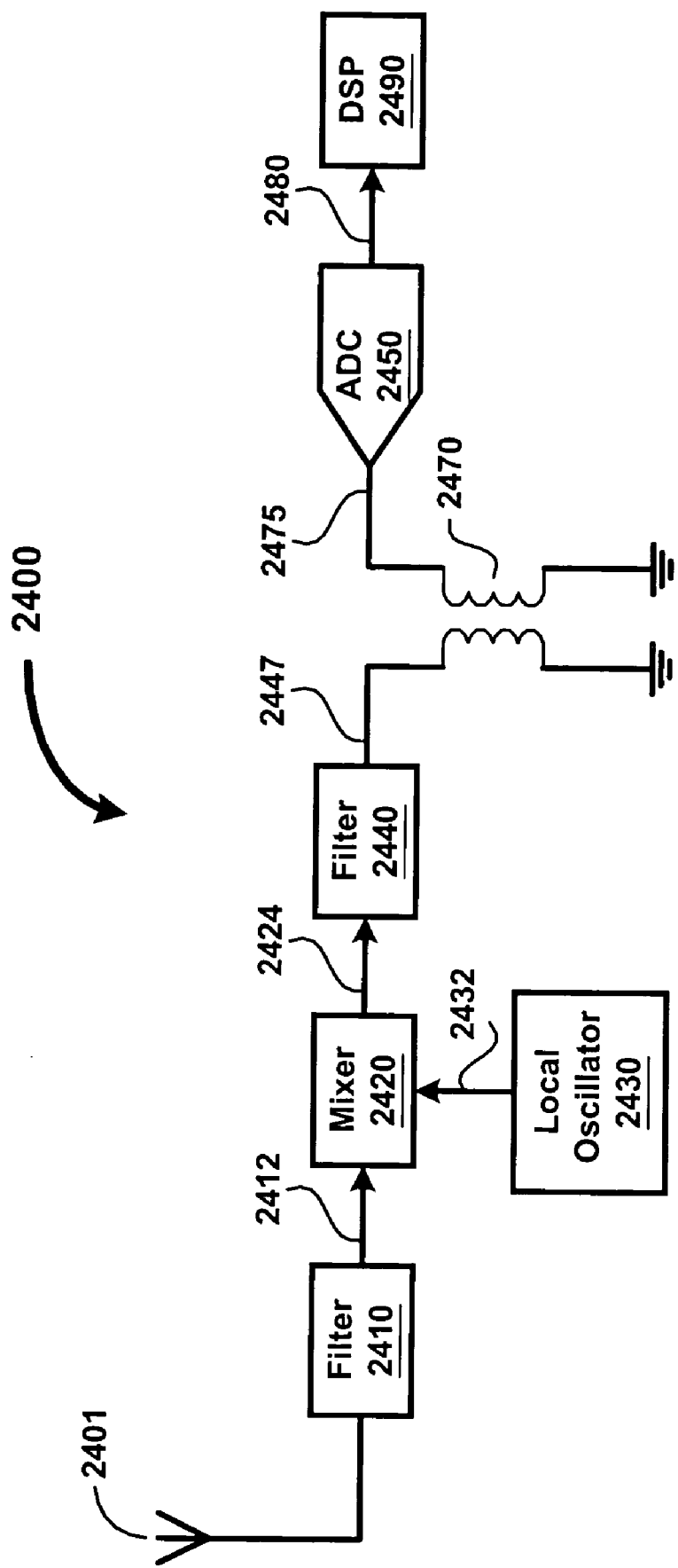
FIG. 24 is a block diagram of a wireless base station system illustrating an example system in which the present invention can be implemented.

FIG. 24 is a block diagram of wireless base station system 2400 illustrating an example system in which the present invention may be implemented. For illustration, it is assumed that wireless base station system 2400 is implemented to transfer signals corresponding to mobile phone, etc. However, various aspects of the present invention can be implemented in other communication systems (e.g., data processing systems, etc.).

Wireless base station system 2400 is shown containing antenna 2401, filters 2410 and 2440, mixer 2420, local oscillator 2430, analog to digital converter (ADC) 2450, voltage source 2460, transformer 2470, and digital signal processor (DSP) 2490. Each component is described in further detail below.

Antenna 2401 may receive various signals transmitted from mobile phones, other wireless base stations, etc. The received signals may be provided to filter 2410. Filter 2410 may perform a corresponding transfer function to generate signals of the frequencies of interest. The generated signals are provided on path 2412 to mixer 2420. Antenna 2401 and filter 2410 may be implemented in a known way.

Local oscillator 2430 generates a signal with a fixed frequency and provides the fixed frequency signal on path 2432. In an embodiment, the signal (on path 2432) of fixed frequency may be generated by a phase locked loop, crystal, etc. in a known way.

Mixer 2420 may be used to convert a high frequency signal to a signal having any desired frequency. In an embodiment, a signal of frequency 1575 MHz is converted to a 4 Mhz signal. Mixer 2420 receives filtered signal on path 2412 and a signal of fixed frequency on path 2432 as inputs and provides the signal with a desired frequency on path 2424.

Filter 2440 filters the signal received on path 2424 to remove any noise components that may be present. In general, a mixer generates noise and the output of mixer contains various noise components including the signal with desired frequency. Filter 2440 provides the signal with desired frequency only on path 2447. Mixer 2420, local oscillator 2430, and filter 2440 may also be implemented in a known way.

Transformer 2470 amplifies the signal received on path 2447 to generate an amplified signal. The amplified signal may be provided to analog to digital converter (ADC) 2450 on path 2475.

ADC 2450 converts the analog signal received on path 2475 to a corresponding digital code. DSP 2490 (example of a processing block) receives the digital code to provide various user applications (such as telephone calls, data applications).

In an embodiment, analog to digital converter (ADC) 2450 contains low voltage transistors and receive high voltage supply of AVDD. However, other components may also contain low voltage transistors for high speed of operation and receive high voltage supply of LVDD. Thus, various aspects of the present invention can be used at several nodes of wireless base station system 2400 as desired to maintain low voltage transistors in safe (voltages that do not damage) operating condition.

25. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An electrical circuit comprising:
a low voltage transistor provided in a high voltage environment, said high voltage environment being characterized by a high supply voltage, said low voltage transistor containing a plurality of terminals, said low voltage transistor being designed to operate at a low cross terminal voltage, wherein said low cross terminal voltage is lower than said high supply voltage, one of said plurality of terminals of said low voltage transistor also receiving a voltage at least substantially equaling said high supply voltage, said low voltage transistor receiving and propagating an analog signal which potentially varies continuously with time.

2. The electrical circuit of claim 1, wherein said analog signal comprises an input signal being processed by said electrical circuit such that said input signal can be processed quickly.

3. The electrical circuit of claim 2, further comprising a second low voltage transistor provided at an output node of said electrical circuit.

4. The electrical circuit of claim 3, wherein a bulk terminal of said second low voltage transistor is connected to a source terminal of said second low voltage transistor.

5. The electrical circuit of claim 4, wherein said second low voltage transistor comprises a PMOS transistor.

6. The electrical circuit of claim 3, further comprising a third low voltage transistor having a first terminal connected to said output node, a bulk terminal of said third low voltage transistor being connected to a voltage greater than said low voltage.

7. The electrical circuit of claim 6, wherein a gate terminal of said third low voltage transistor is coupled to a clock signal having a high level greater than or equal to said low voltage.

8. The electrical circuit of claim 7, wherein said high level of said clock signal is substantially more than said low voltage to provide a high drive strength for said third tow voltage transistor, and a low level of said clock signal is greater than or equal to voltage of said high level - a maximum permissible voltage level of said low voltage transistor.

9. The electrical circuit of claim 1, wherein said low voltage transistor operates in a saturation mode when propagating said input signal.

10. The electrical circuit of claim 1, wherein said low voltage transistor is comprised in an amplifier.

11. The electrical circuit of claim 1, further comprising a high voltage transistor being designed to operate at said high supply voltage, said high voltage transistor and said low voltage transistor being comprised in a single integrated circuit.

12. An electrical circuit comprising:
a low voltage transistor designed for operation at a low voltage and having a maximum permissible voltage, said low voltage transistor containing a plurality of terminals including a first terminal and a second terminal, said low voltage transistor being connected to a first higher voltage and said second terminal being connected to receive an analog signal which potentially varies continuously with time, wherein said first higher voltage is greater than said low voltage, wherein a cross terminal voltage between said first terminal and each of the remaining terminals is constrained to not exceed said maximum permissible voltage, said low voltage transistor operating to propagate said analog signal.

13. The electrical circuit of claim 12, wherein said first higher voltage comprises a substantial fraction of a high supply voltage associated with a high voltage environment.

14. The electrical circuit of claim 13, further comprising a high voltage transistor designed for operation at said high supply voltage.

15. The electrical circuit of claim 14, wherein said low voltage transistor comprises a PMOS transistor, wherein a bulk terminal of said PMOS transistor is connected to a source terminal of said PMOS transistor, wherein both of said bulk terminal and said source terminal are coupled to receive a slightly less voltage than said high supply voltage.

16. The electrical circuit of claim of claim 14, wherein said low voltage transistor comprises a PMOS transistor, wherein a bulk terminal of said PMOS transistor is connected to a voltage slightly higher than said low voltage.

17. The electrical circuit of claim 16, wherein said bulk terminal is connected to 2.1V and said low voltage equals 1.8V.

18. The electrical circuit of claim 12, wherein said low voltage transistor is designed to operate in a saturation mode when propagating said analog signal.

19. The electrical circuit of claim 18, wherein said low voltage transistor is comprised in an amplifier.

20. A device comprising:
a low voltage transistor in a high voltage environment, wherein said high voltage environment is characterized by a high supply voltage and a voltage equaling said high supply voltage is applied to one of the terminals of said low voltage transistor, another one of the terminals of said low voltage transistor being connected to receive an analog signal which potentially varies continuously with time, said low voltage transistor operating to propagate said analog signal; and
means for constraining cross terminal voltages of said low voltage transistor to substantially less than a maximum permissible voltage for which said low voltage transistor is designed, wherein said maximum permissible voltage is less than said high supply voltage.

21. The device of claim 20, wherein said means for constraining does not contain a low voltage regulator which generates said low voltage from said high voltage.

22. The device of claim 20, wherein said cross terminal voltages are constrained to not substantially more than a low voltage for which said low voltage transistor is designed.

23. The electrical circuit of claim 20, wherein said low voltage transistor is designed to operate in a saturation mode when propagating said analog signal.

24. A method of implementing an electrical circuit, said method comprising:
providing a low voltage transistor in a high voltage environment, wherein said high voltage environment is characterized by a high supply voltage and a voltage equaling said high supply voltage is applied to one of the terminals of said low voltage transistor, another one of the terminals of said low voltage transistor being connected to receive an analog signal which potentially varies continuously with time, said low voltage transistor operating to propagate said analog signal; and constraining cross terminal voltages of said low voltage transistor to substantially less than a maximum permissible voltage for which said low voltage transistor is designed, wherein said maximum permissible voltage is less than said high supply voltage.

25. The method of claim 24, wherein said constraining is performed without using a low voltage regulator which generates said low voltage from said high voltage.

26. The method of claim 24, wherein said cross terminal voltages are constrained to not substantially more than a low voltage for which said low voltage transistor is designed.

27. A method of implementing an electrical circuit with a high SNR and a high throughput performance, wherein said electrical circuit is designed to process an input signal and generate an output signal, said method comprising:

using a high supply voltage for said electrical circuit; and providing a low voltage transistor in a path from said input signal to said output signal, wherein said low voltage transistor provides said high throughput performance and wherein said use of high supply voltage enables providing said high SNR, wherein said input signal comprises an analog signal.

28. The method of claim 27, wherein said low voltage equals 3.3 V and said high supply voltage equals 1.8V.

29. The method of claim 27, wherein said output signal comprises an analog signal.

* * * * *